(12) United States Patent
Kamono

(10) Patent No.: US 6,762,821 B2
(45) Date of Patent: Jul. 13, 2004

(54) GAS PURGE METHOD AND EXPOSURE APPARATUS

(75) Inventor: Takashi Kamono, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/166,640

(22) Filed: Jun. 12, 2002

(65) Prior Publication Data

US 2002/0192579 A1 Dec. 19, 2002

(30) Foreign Application Priority Data

Jun. 18, 2001 (JP) .......................... 2001-182919

(51) Int. Cl.[7] .................... G03B 27/52; G03B 27/58; G03B 27/62
(52) U.S. Cl. ........................ 355/30; 355/72; 355/75
(58) Field of Search ........................ 355/30, 53, 72, 355/75, 76; 430/5, 20, 30; 378/34, 35

(56) References Cited

U.S. PATENT DOCUMENTS 6,317,479 B1 * 11/2001 Chiba et al. ................. 378/35
6,346,986 B1 * 2/2002 Nguyen ...................... 356/601
2002/0126269 A1 * 9/2002 Sato .......................... 355/77

FOREIGN PATENT DOCUMENTS

| JP | 6-27643 | 2/1994 |
| JP | 9-73167 | 3/1997 |
| JP | 9-197652 | * 7/1997 |

OTHER PUBLICATIONS

Okabe, Hideo. "Photochemistry of Small Molecules," A Wiley–Interscience Publicati n, 1978, pp. 176–183.

* cited by examiner

Primary Examiner—Henry Hung Nguyen
(74) Attorney, Agent, or Firm—Fitzpatrick, Cella, Harper & Scinto

(57) ABSTRACT

An exposure apparatus includes a pellicle support frame which has a freely openable/closable lid and forms a pellicle space by using a pellicle film, and a pattern of a master facing the pellicle space is transferred onto a photosensitive substrate via a projection optical system. The apparatus includes a mechanism which opens/closes the lid, a nozzle arranged by selecting at least either one of a gas supply nozzle and a discharge nozzle, wherein at least either one of a gas supply and discharge is performed for the pellicle space via the selected nozzle, a device for measuring flexure of the pellicle film, a pressure detection device for detecting either one of a gas supply pressure and a discharge pressure, and a pressure control device for controlling the pressure detected by the pressure detection device. The pressure control device controls either one of the gas supply pressure and the discharge pressure so as to adjust a flexure value detected by the device for measuring flexure of the pellicle film to not more than a predetermined value.

7 Claims, 19 Drawing Sheets

FIG. 17

```
URL  http://www.maintain.co.jp/db/input.html

TROUBLE DB INPUT WINDOW

OCCURRENCE DATE    2000/3/15  ~404
TYPE OF APPARATUS  **********  ~401
OBJECT     OPERATION ERROR (START-UP ERROR)  ~403
DEVICE S/N         465NS4580001  ~402
DEGREE OF URGENCY  D  ~405
SYMPTOM    LED KEEPS FLICKERING
           AFTER POWER ON               ~406

REMEDY     POWER ON AGAIN
           (PRESS RED BUTTON IN ACTIVATION)  ~407

PROGRESS   INTERIM HAS BEEN DONE.         ~408

(SEND) (RESET)     410            411           412
LINK TO RESULT LIST DATABASE  SOFTWARE LIBRARY  OPERATION GUIDE
```

SEMICONDUCTOR DEVICE MANUFACTURING FLOW

WAFER PROCESS

GAS PURGE METHOD AND EXPOSURE APPARATUS

FIELD OF THE INVENTION

The present invention relates to a gas purge method which is preferably applied to an exposure apparatus that uses ultraviolet rays as exposure light, purges the interior of the apparatus with gas, and projects the pattern of a master such as a mask onto a photosensitive substrate via a projection optical system, and which purges with gas a pellicle space defined by a master and a pellicle used to prevent deposition of a foreign matter on a pattern surface. The present invention also relates to an exposure apparatus having a gas purge apparatus for purging the pellicle space with gas.

BACKGROUND OF THE INVENTION

A conventional manufacturing process for a semiconductor element such as an LSI or a VLSI formed from a micropattern uses a reduction type projection exposure apparatus for printing and forming by reduction projection a circuit pattern drawn on a master such as a mask onto a substrate coated with a photosensitive agent. With an increase in the packaging density of semiconductor elements, demands have arisen for further micropatterning. Exposure apparatuses are coping with micropatterning along with the developing of a resist process.

A means for increasing the resolving power of the exposure apparatus includes a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with a wavelength around ultraviolet rays, particularly, 193 nm, and a fluorine ($F_2$) excimer laser with an oscillation wavelength around 157 nm are known to have an oxygen ($O_2$) absorption band around their wavelength band.

For example, a fluorine excimer laser has been applied to an exposure apparatus because of a short wavelength of 157 nm. The 157-nm wavelength falls within a wavelength region called a vacuum ultraviolet region. In this wavelength region, light is greatly absorbed by oxygen molecules, and hardly passes through the air. The fluorine excimer laser can only be applied in an environment in which the atmospheric pressure is decreased to almost vacuum and the oxygen concentration is fully decreased. According to the reference "Photochemistry of Small Molecules" (Hideo Okabe, A Wiley-Interscience Publication, 1978, page 178), the absorption coefficient of oxygen to 157-nm light is about 190 $atm^{-1}cm^{-1}$. This means when 157-nm light passes through gas at an oxygen concentration of 1% at one atmospheric pressure, the transmittance T per cm is only $T=\exp(-190\times1\ cm\times0.01\ atm)=0.150$.

Oxygen absorbs light to generate ozone ($O_3$), and the ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to a low level on the order of several ppm order or less by a purge means using inert gas such as nitrogen in the optical path of the exposure optical system of a projection exposure apparatus using a far ultraviolet laser such as an ArF excimer laser or a fluorine ($F_2$) excimer laser as a light source.

In such an exposure apparatus using an ArF excimer laser with a wavelength around ultraviolet rays, particularly, 193 nm, or a fluorine ($F_2$) excimer laser with a wavelength around 157 nm, an ArF excimer laser beam or a fluorine ($F_2$) excimer laser beam is readily absorbed by a substance. A light absorption substance in the optical path must be purged to several ppm order or less. This also applies to moisture, which must be removed to a ppm order or less.

For this reason, the interior of the exposure apparatus, particularly, the optical path of ultraviolet rays is purged with inert gas. A load-lock mechanism is arranged at a coupling portion between the inside and outside of the exposure apparatus. When a reticle or wafer is to be externally loaded, the interior of the exposure apparatus is temporarily shielded from outside air. After the impurity in the load-lock mechanism is purged with inert gas, the reticle or wafer is loaded into the exposure apparatus.

FIG. 1 is a schematic sectional view showing an example of a semiconductor exposure apparatus having a fluorine ($F_2$) excimer laser as a light source and a load-lock mechanism.

In FIG. 1, reference numeral 1 denotes a reticle stage for setting a reticle bearing a pattern; 2, a projection optical system for projecting the pattern on the reticle onto a wafer serving as a photosensitive substrate; 3, a wafer stage which supports the wafer and is driven in the X, Y, Z, θ, and tilt directions; 4, an illumination optical system for illuminating the reticle with illumination light; and 5, a guide optical system for guiding light from the light source to the illumination optical system 4.

Reference numeral 6 denotes a fluorine ($F_2$) laser serving as a light source; 7, a masking blade for shielding exposure light so as not to illuminate the reticle except for the pattern region; 8 and 9, housings which cover the exposure optical path around the reticle stage 1 and wafer stage 3, respectively; and 10, an He air-conditioner for adjusting the interiors of the projection optical system 2 and illumination optical system 4 to a predetermined He atmosphere.

Reference numerals 11 and 12 denote $N_2$ air-conditioners for adjusting the interiors of the housings 8 and 9 to a predetermined $N_2$ atmosphere; 13 and 14, reticle load-lock chambers and wafer load-lock chambers used to load a reticle and wafer into the housings 8 and 9, respectively; and 15 and 16, a reticle hand and wafer hand for transferring the reticle and wafer, respectively.

Reference numeral 17 denotes a reticle alignment mark used to adjust the reticle position; 18, a reticle stocker for stocking a plurality of reticles in the housing 8; and 19, a pre-alignment unit for pre-aligning the wafer.

If necessary, the overall apparatus is stored in an environment chamber (not shown). Air controlled to a predetermined temperature is circulated within the environment chamber to keep the internal temperature of the chamber constant.

FIG. 2 is a schematic sectional view showing another example of the semiconductor exposure apparatus having a fluorine ($F_2$) excimer laser as a light source and a load-lock mechanism. In FIG. 2, the same reference numerals as in FIG. 1 denote the same parts.

The whole exposure apparatus shown in FIG. 2 is covered with a housing 20, and $O_2$ and $H_2O$ in the housing 20 are purged with $N_2$ gas. Reference numeral 21 denotes an air-conditioner for setting the entire housing 20 in an $N_2$ atmosphere. In this exposure apparatus, the lens barrel of a projection optical system 2 and the internal space of an illumination optical system 4 are partitioned from the internal space (driving system space) of the housing 20, and independently adjusted to an He atmosphere. Reference numerals 13 and 14 denote a reticle load-lock chamber and wafer load-lock chamber used to load a reticle and wafer into the housing 20, respectively.

In general, a reticle is equipped with a pattern protection device called a pellicle. The pellicle prevents deposition of a foreign matter onto a reticle pattern surface, and suppresses the occurrence of defects caused by transfer of a foreign matter onto a wafer. FIG. 3 is a schematic view showing the structure of a pellicle.

A pellicle 24 is adhered to the pattern surface of a reticle 23 with an adhesive agent or the like. The pellicle 24 is made up of a support frame 25 large enough to surround the reticle pattern, and a pellicle film 26 which is adhered to one end face of the support frame 25 and transmits exposure light. If a space (to be referred to as a pellicle space hereinafter) defined by the pellicle 24 and reticle 23 is completely closed, the pellicle film may expand or contract due to the difference in atmospheric pressure between the inside and outside of the pellicle space or the difference in oxygen concentration. To prevent this, a vent hole 27 is formed in the support frame 25 so as to allow gas from flowing between the inside and outside of the pellicle space. An auto-screen filter (not shown) is attached to the ventilation path in order to prevent an external foreign matter from entering the pellicle space via the vent hole 27.

FIG. 4 is a schematic view showing an example of a reticle transfer path in the exposure apparatus shown in FIGS. 1 and 2.

In FIG. 4, reference numeral 22 denotes a foreign matter inspection device which measures the size and number of foreign matters such as dust deposited on the surface of the reticle 23 or pellicle film 26. The reticle 23 is loaded manually or by a transfer device (not shown) into the reticle load-lock chamber 13 serving as the entrance of the exposure apparatus. Since the reticle 23 and pellicle 24 are generally adhered outside the exposure apparatus, the pellicle 24 has already been adhered to the loaded reticle 23.

The interior of the reticle load-lock chamber 13 is purged with inert gas until the interior reaches an inert gas atmosphere similarly to the housing 8. After that, the reticle 23 is transferred by the reticle hand 15 to any one of the reticle stage 1, reticle stocker 18, and foreign matter inspection device 22.

As described above, an exposure apparatus using ultraviolet rays, particularly, an ArF excimer laser beam or fluorine ($F_2$) excimer laser beam suffers from large absorption of the ArF excimer laser beam or fluorine ($F_2$) excimer laser of its wavelength by oxygen and moisture. To obtain a sufficient transmittance and stability of an ultraviolet ray, the oxygen and moisture concentrations must be reduced and controlled strictly. For this purpose, a load-lock mechanism is arranged at a coupling portion between the inside and outside of the exposure apparatus. When a reticle or wafer is to be externally loaded, the interior of the exposure apparatus is temporarily shielded from outside air. After the impurity in the load-lock mechanism is purged with inert gas, the reticle or wafer is loaded into the exposure apparatus.

To ensure the transmittance and stability of a fluorine ($F_2$) excimer laser beam, the whole reticle stage (wafer stage) including the end face of a projection lens and a critical dimension measurement interference optical system is housed in an airtight chamber, and the interior of the chamber is purged with high-purity inert gas. In addition, the reticle load-lock chamber is disposed adjacent to the airtight chamber in order to load/unload a wafer or reticle into/from the airtight chamber while maintaining a constant internal inert gas concentration.

A reticle loaded into the load-lock chamber bears a pellicle, and the pellicle space can communicate with outside air only through a relatively small vent hole. This structure prolongs a time required to complete purge in the pellicle space even after the interior of the reticle load-lock chamber reaches a predetermined inert gas concentration, degrading the productivity.

Japanese Patent Laid-Open No. 9-73167 discloses an invention of adhering a reticle and pellicle in advance in an inert gas atmosphere and filling the pellicle space with an inert gas at an oxygen concentration of 1% or less. However, the transmittance of 157-nm light is merely 15% per cm in atmospheric-pressure gas at an oxygen concentration of 1%. At present, the air gap between the reticle and the pellicle is about 6 mm. Even if this air gap is filled with gas at an oxygen concentration of 0.1%, the transmittance of 157-nm light at this air gap is merely 89.2%.

The total space distance of an optical path from the light source of the exposure apparatus to a wafer exceeds at least 1 m. To ensure a transmittance of 80% or more in the 1-m space, the oxygen concentration must be suppressed to 10 ppm or less, and ideally 1 ppm or less. In the pellicle space, the oxygen concentration must be 1 to 100 ppm or less in terms of the balance with another space and maintenance of the transmittance in the total space distance. This also applies to the moisture and carbon dioxide gas concentrations.

A pellicle film made of a fluorine-based resin has oxygen permeability, and the oxygen concentration is difficult to maintain in the ppm order. A reticle may be set on the reticle stage and exposed at an unsatisfactory inert gas concentration in the pellicle space. Since the inert gas concentration in the pellicle space gradually comes close to an ambient inert gas concentration on the reticle stage, the transmittance of exposure light in the pellicle space changes. As a result, a predetermined exposure amount cannot be stably obtained on a wafer, and an error such as a change in transfer pattern size may occur.

As for the vent hole of a pellicle support frame, Japanese Patent Laid-Open Nos. 6-27643 and 9-197652 disclose inventions providing intake and discharge holes. Japanese Patent Laid-Open No. 9-197652 also discloses an invention in which inert gas is supplied into a pellicle space via a vent hole formed in advance in a pellicle support frame and then the vent hole is sealed. This is, however, insufficient to purge gas in the pellicle space of a master with a pellicle loaded into an apparatus, and gas must be purged more efficiently.

SUMMARY OF THE INVENTION

The present invention has been made to overcome the conventional drawbacks, and has as its object to provide a means for effectively purging a space defined by a master and pellicle film with inert gas or the like in an exposure apparatus which uses ultraviolet rays as exposure light, purges the interior of the apparatus with inert gas or the like, and projects the pattern of a master onto a photosensitive substrate via a projection optical system.

To achieve the above object, according to the present invention, there is provided a gas purge method comprising the steps of opening a lid to perform either one of gas supply and discharge with respect to a pellicle space formed using a pellicle support frame having the freely openable/closable lid and a pellicle film, and controlling ether one of gas supply and discharge so as to make a detection value obtained by detecting a state of the pellicle space fall within a predetermined range. The gas may include any one of nitrogen gas, helium gas, and argon gas.

According to the present invention, there is provided an exposure apparatus in which a pellicle support frame which has a freely openable/closable lid and forms a pellicle space by using a pellicle film is mounted, and a pattern of a master facing the pellicle space is transferred onto a photosensitive substrate via a projection optical system, wherein the exposure apparatus incorporates a mechanism which opens/closes the lid, and a nozzle arranged by selecting at least one of a gas supply nozzle and a discharge nozzle, and at least one of gas supply and discharge is performed for the pellicle space via the selected nozzle.

According to the present invention, there is provided an exposure apparatus which uses ultraviolet rays as exposure light and projects a pattern of a mask onto a photosensitive substrate via a projection optical system, wherein a mechanism which opens/closes a lid attached to a pellicle support frame, a gas supply nozzle, and a discharge nozzle are inserted in a reticle transfer path within the exposure apparatus, and gas is supplied from the gas supply nozzle into a pellicle space and discharged from the discharge nozzle after the lid of the pellicle support frame is opened.

The exposure apparatus of the present invention may adopt the mechanism which opens/closes the lid attached to the pellicle support frame on a master, and either one of the gas supply nozzle and discharge nozzle. Gas may be supplied from the gas supply nozzle into the pellicle space after the lid of the pellicle support frame is opened. Alternatively, the pellicle space may be purged from the gas discharge nozzle to supply ambient gas from the gas inlet port of the pellicle support frame into the pellicle space.

In the exposure apparatus of the present invention, the mechanism which opens/closes the lid attached to the pellicle support frame, and the gas supply nozzle or gas discharge nozzle are desirably arranged in at least any one of a master load-lock chamber, master stocker, and master stage.

When the mechanism and nozzle are arranged in the master load-lock chamber, the interior of the master load-lock chamber is purged after a master is externally loaded into the master load-lock chamber. At almost the same time as the start of gas purge, the interior of the pellicle space can be purged with gas by opening the lid of the pellicle support frame. After the interior of the load-lock chamber is purged with clean gas, the interior of the pellicle space can also be purged with gas by opening the lid of the pellicle support frame. Entrance of a foreign matter in a clean room atmosphere into the pellicle space can be prevented.

When the mechanism and nozzle are arranged in the master stocker, the pellicle space need not be purged with gas within the master load-lock chamber in a case in which a master loaded from the master load-lock chamber into an airtight chamber is temporarily stocked in the master stocker. While the master is stocked in the master stocker, satisfactory gas purge can be achieved by opening the lid of the pellicle support frame.

When the mechanism and nozzle are arranged on the master stage, the lid of the pellicle support frame is kept open until the end of an exposure operation after a master is set on the master stage. This allows continuously purging the pellicle with gas.

In any case, the lid of the pellicle support frame is closed after purge. Since a vent hole is formed in the pellicle support frame, a pellicle does not expand or contract and can undergo foreign matter inspection and exposure. Even if a master with a pellicle is transferred into an atmosphere through the load-lock chamber after the end of exposure, entrance of a foreign matter into the pellicle space can be prevented.

The present invention may be characterized by comprising means for measuring flexure of the pellicle film. The exposure apparatus desirably further comprises flow rate detection means for detecting either one of a gas supply flow rate and a discharge flow rate, and flow rate control means for controlling the flow rate. The flow rate control means controls the flow rate so as to adjust a flexure value detected by the pellicle flexure measurement means to a predetermined value or less, thereby minimizing deformation of the pellicle film during purge. The same effects can also be attained by employing, instead of the flow rate detection means and flow rate control means, pressure detection means for detecting either one of a gas supply pressure and a discharge pressure and pressure control means for controlling either one of the gas supply pressure and the discharge pressure, or speed detection means for detecting either one of a gas supply speed and a discharge speed and speed control means.

The means for measuring flexure of the pellicle film desirably includes light-projecting means for emitting collimated light, light-receiving means formed from a sensor which measures a position of light emitted by the light-projecting means and reflected by the pellicle film, and arithmetic means for calculating flexure of the pellicle film from a light reception position. The means for measuring flexure of the pellicle film desirably includes means using any one of a limited-reflection photoelectric sensor, an electrostatic capacitance sensor, and an ultrasonic displacement sensor.

An exposure apparatus according to the present invention comprises means for measuring an impurity concentration in the pellicle space, and can perform gas purge until a gas concentration in the pellicle space reaches a predetermined purity. The means for measuring the impurity concentration can be combined with flow rate adjustment means and control means. In this case, gas purge can be adjusted to a proper flow rate in order to maintain the gas concentration in the pellicle space at a predetermined purity.

The means for measuring the impurity concentration in the pellicle space desirably includes light-projecting means for emitting light with a wavelength of not more than 200 nm, light-receiving means formed from a sensor which measures a quantity of light emitted by the light-projecting means and having passed through the pellicle space, and arithmetic means for calculating the impurity concentration from a quantity of light attenuated when light emitted by the light-projecting means passes through the pellicle space. Light from a light source of the exposure apparatus serving as a light source of the light-projecting means for emitting light with a wavelength of not more than 200 nm is preferably split and guided through an optical fiber. A light-projecting portion is desirably shared between the means for measuring flexure of the pellicle film and the means for measuring the impurity concentration in the pellicle space.

An exposure apparatus according to the present invention may be characterized in that an injection direction of gas supplied from a gas supply nozzle and a gas supply hole are arranged to be substantially aligned. An exposure apparatus according to the present invention may be characterized in that a discharge direction of gas discharged from a gas discharge nozzle and a gas discharge hole are arranged to be substantially aligned. Gas injected from the gas supply nozzle can enter the pellicle space with little resistance, the gas purge efficiency can be increased, and the purge time can be shortened.

In the exposure apparatus of the present invention, the flow direction of gas may be switched during purge in order to eliminate stagnation of gas at the inner corner or center of the pellicle support frame and promote spread of gas in the pellicle space. In any case, the gas desirably includes inert gas.

In the exposure apparatus of the present invention, the ultraviolet rays may include a laser beam from a laser serving as a light source. Examples of the laser beam are a fluorine excimer laser beam with a wavelength of 200 nm or less, and an ArF excimer laser beam.

In the exposure apparatus of the present invention, the gas which purges the optical path of the exposure light consists of one gas selected from the group consisting of nitrogen gas, helium gas, and argon gas.

The exposure apparatus of the present invention can comprise purge means for filling gas in the exposure apparatus.

The present invention can also be applied to a semiconductor device manufacturing method comprising the steps of installing manufacturing apparatuses for performing various processes, including any one of the above-described exposure apparatuses, in a semiconductor manufacturing factory, and manufacturing a semiconductor device by performing a plurality of processes using the manufacturing apparatuses. The semiconductor device manufacturing method desirably further comprises the steps of connecting the manufacturing apparatuses to a local area network, and communicating information about at least one of the manufacturing apparatuses between the local area network and an external network outside the semiconductor manufacturing factory. A database provided by a vendor or user of the exposure apparatus is preferably accessed via the external network to obtain maintenance information of the manufacturing apparatus by data communication. Alternatively, data communication is preferably performed between the semiconductor manufacturing and another semiconductor manufacturing factory via the external network to perform production management.

The present invention can also be applied to a semiconductor manufacturing factory comprising manufacturing apparatuses for performing various processes, including any one of the above-described exposure apparatuses, a local area network for connecting the manufacturing apparatuses, and a gateway for connecting the local area network to an external network outside the factory, wherein information about at least one of the manufacturing apparatuses can be communicated.

The present invention can also be applied to a maintenance method for any one of the above-described exposure apparatuses installed in a semiconductor manufacturing factory, comprising the steps of providing a maintenance database connected to an external network of a semiconductor manufacturing factory by a vendor or user of the exposure apparatus, authorizing access to the maintenance database from the semiconductor manufacturing factory via the external network, and transmitting maintenance information accumulated in the maintenance database to the semiconductor manufacturing factory via the external network.

The present invention may be characterized in that any one of the above-described exposure apparatuses further comprises a display, a network interface, and a computer which executes network software, and maintenance information of the exposure apparatus is communicated via a computer network. The network software preferably provides on the display a user interface for accessing a maintenance database which is provided by a vendor or user of the exposure apparatus and connected to the external network outside a factory where the exposure apparatus is installed, and enables obtaining information from the database via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 11 is a schematic view showing a mechanism of opening/closing the lid of the pellicle support frame in the fifth embodiment of the present invention, in which FIG. 11 is a sectional view when viewed from an arrow C;

FIG. 17 is a view showing an example of a user interface;

DETAILED DESCRIPTION OF THE PREFERRED EMBODIMENTS

An exposure apparatus according to embodiments of the present invention is applied to a known exposure apparatus which uses ultraviolet rays as exposure light, purges the interior of the apparatus with inert gas, and projects the pattern of a mask serving as a master onto a photosensitive substrate via a projection optical system.

The use of ultraviolet rays as exposure light in the exposure apparatus according to the present invention is not limited. The present invention is effective for far ultraviolet lasers, and particularly, an ArF excimer laser with a wavelength around 193 nm and a fluorine ($F_2$) excimer laser with a wavelength around 157 nm.

Examples of inert gas are nitrogen gas, helium gas, and argon gas.

Preferred embodiments of the present invention will be described in detail below with reference to the accompanying drawings.

First Embodiment

Figure 5:
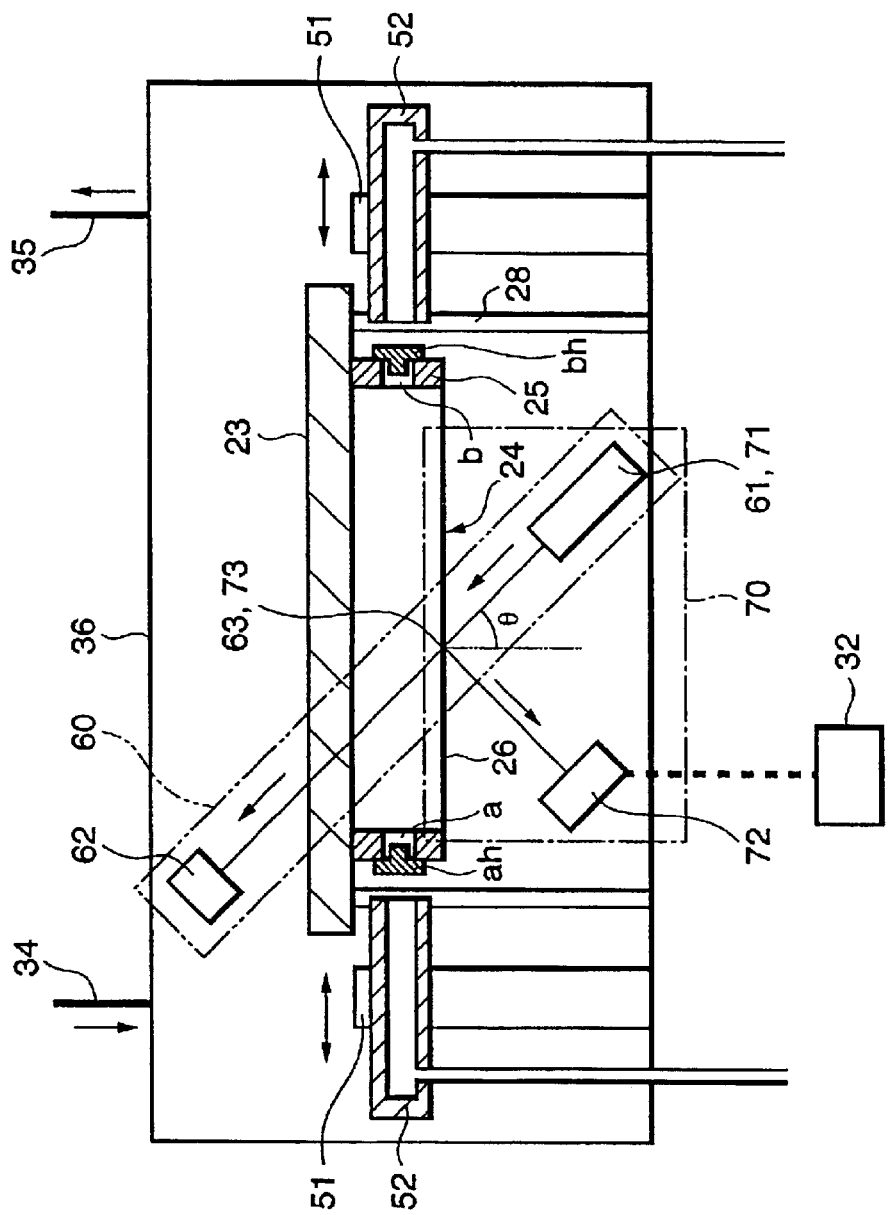
FIG. 5 is a schematic view showing the first embodiment of the present invention.

FIG. 5 is a schematic view showing a purge mechanism for purging a pellicle space with inert gas according to the first embodiment of the present invention.

Figure 1:
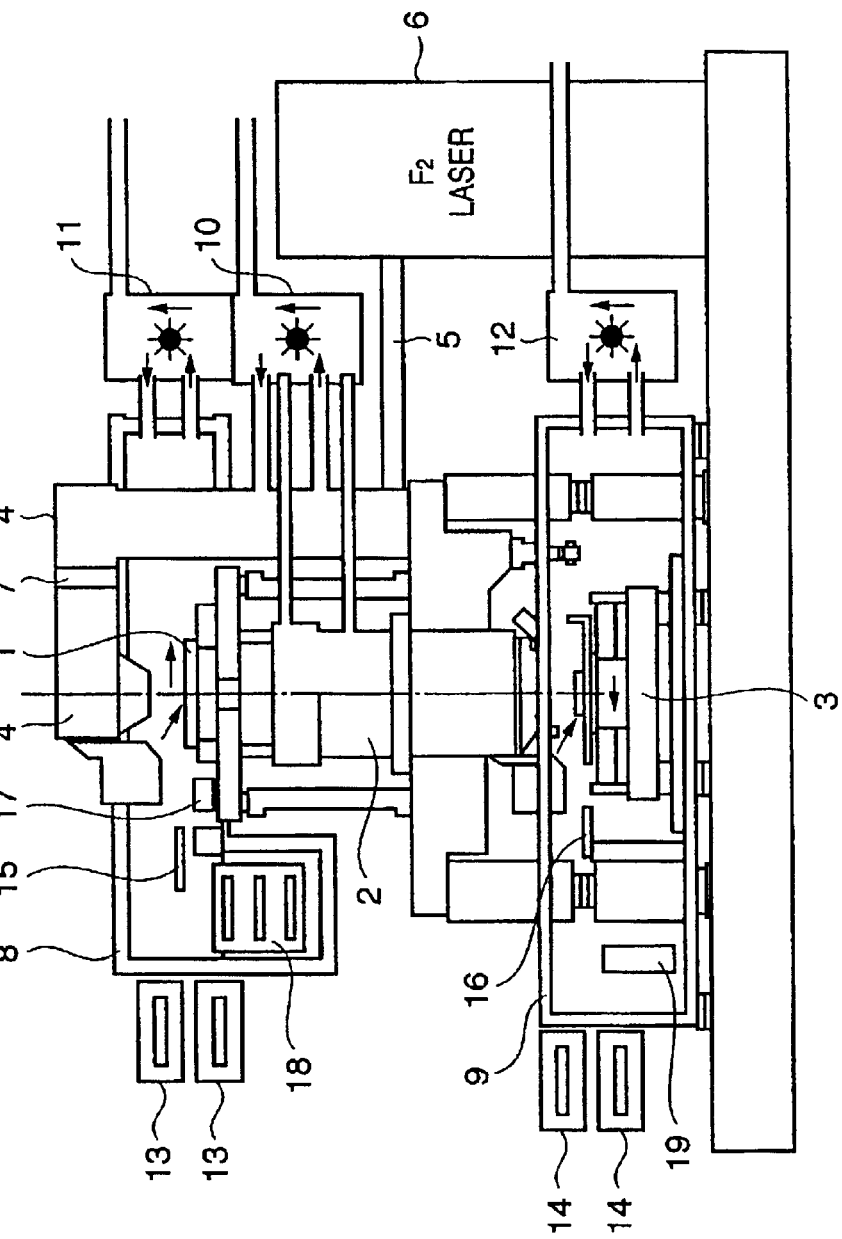
FIG. 1 is a sectional view showing the schematic arrangement of a projection exposure apparatus to which the present invention is preferably applied.
Figure 2:
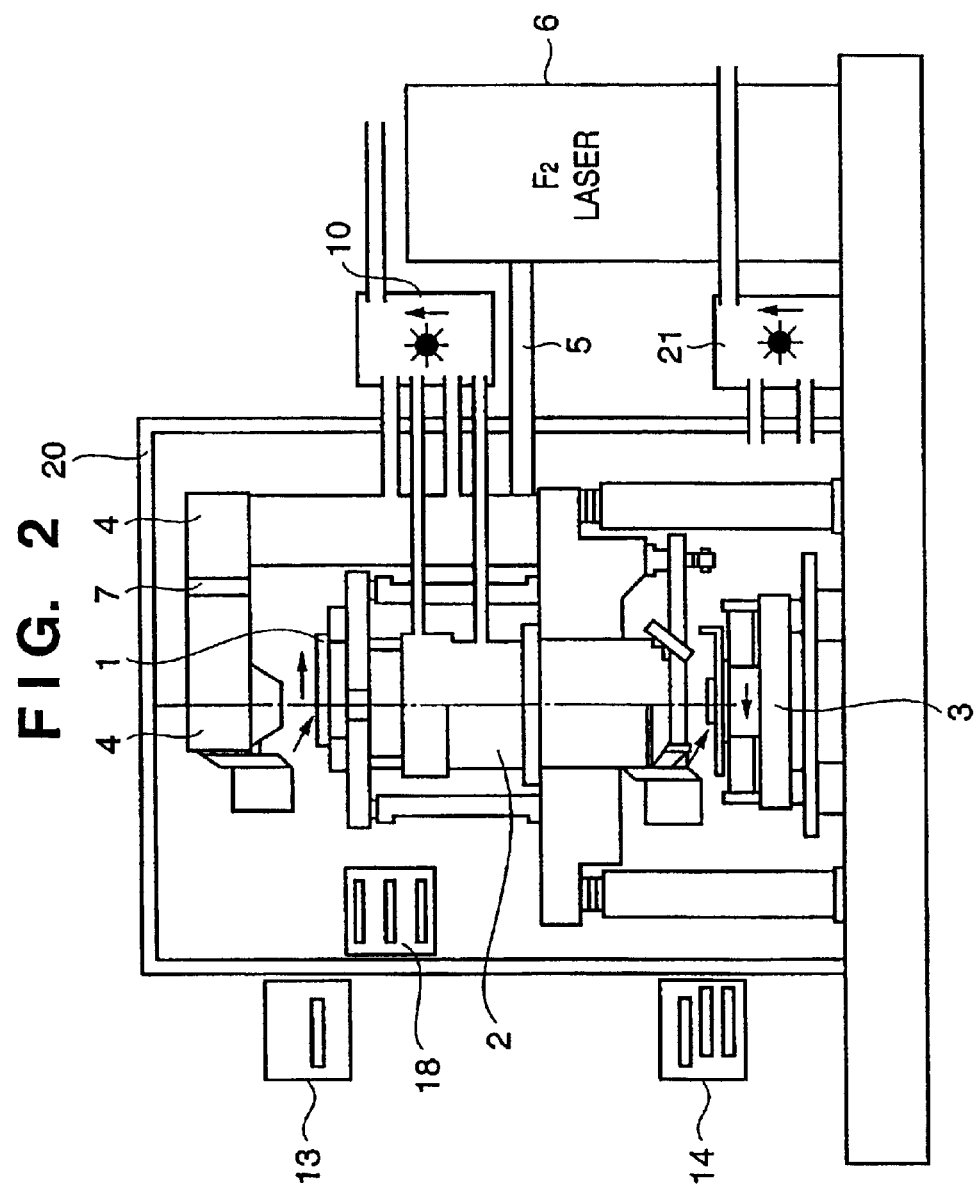
FIG. 2 is a sectional view showing the schematic arrangement of another projection exposure apparatus to which the present invention is preferably applied.
Figure 3:
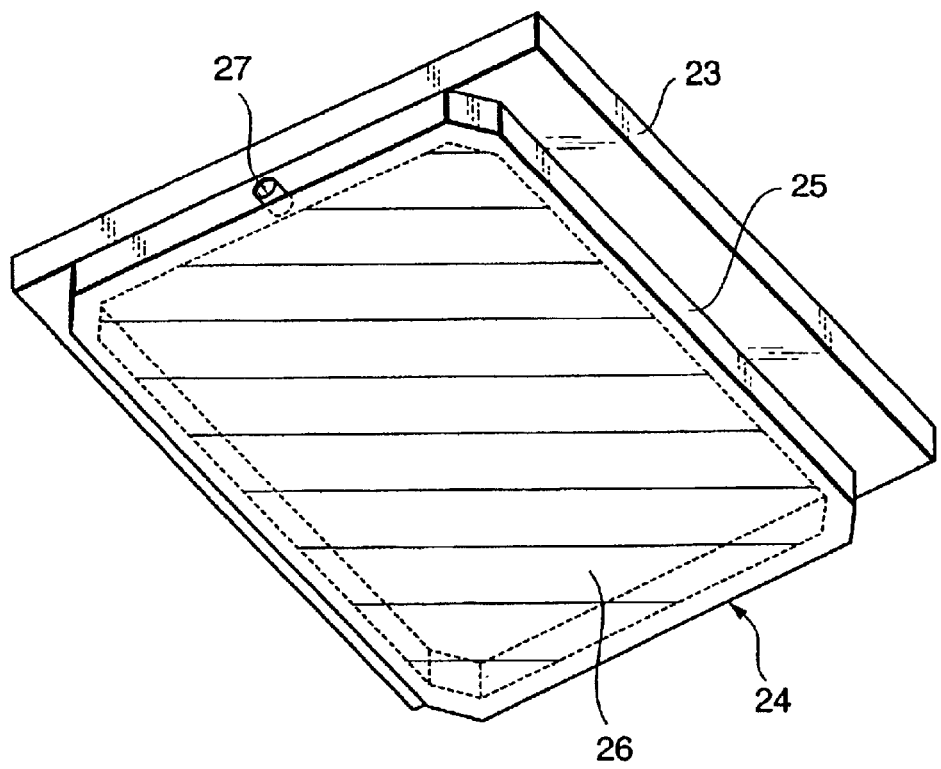
FIG. 3 is a perspective view showing the schematic arrangement of a pellicle adhered to a reticle.
Figure 4:
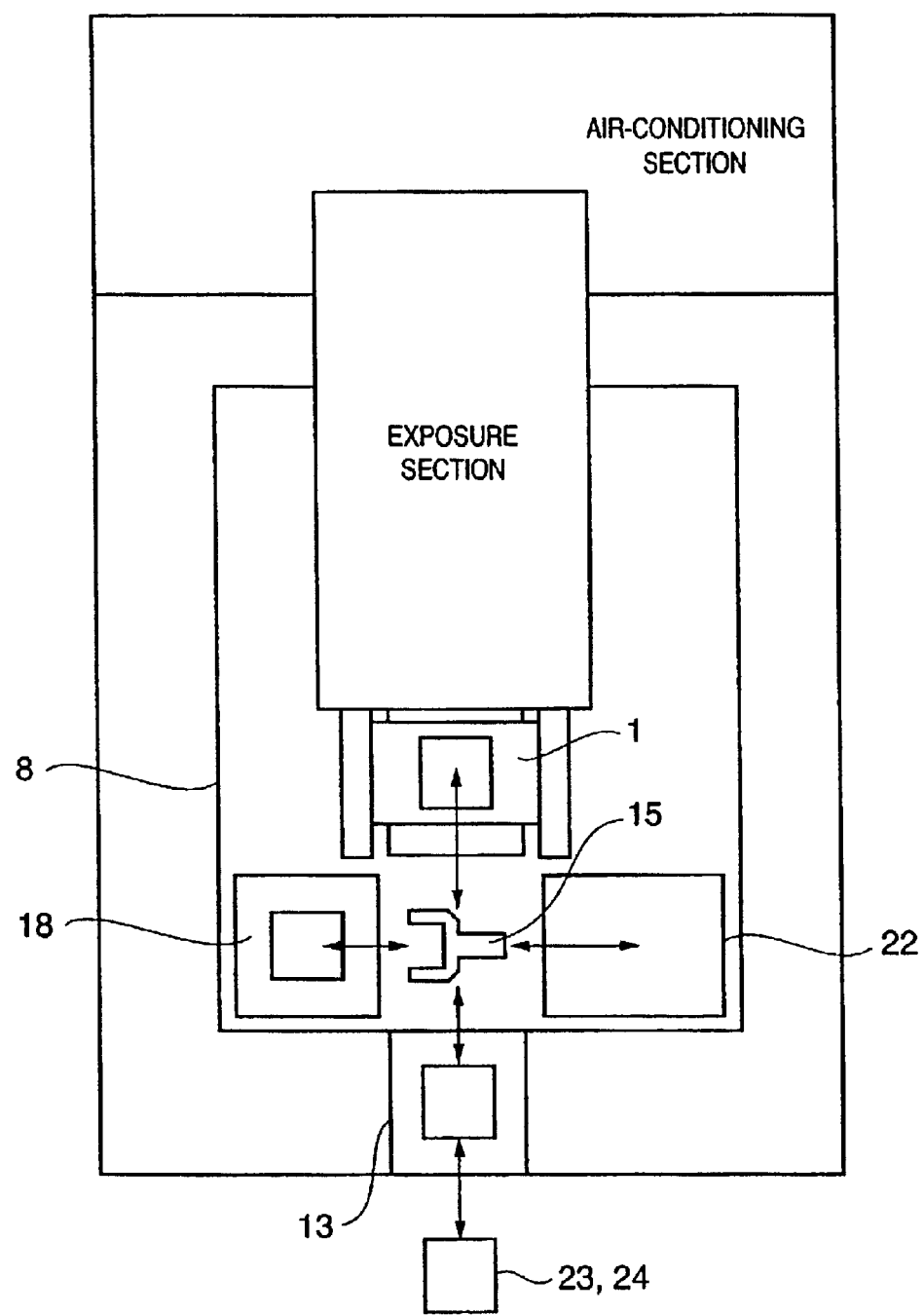
FIG. 4 is a schematic view showing particularly the reticle transfer path of the projection exposure apparatus to which the present invention is preferably applied.

In FIG. 5, an airtight chamber 36 corresponds to a reticle stage 1, a housing 8 which contains a reticle stocker 18, or a reticle load-lock chamber 13 in FIG. 1. Inert gas is introduced into the airtight chamber 36 via an inert gas supply line 34 and discharged via an inert gas discharge line 35, thereby purging the interior of the airtight chamber 36 with inert gas. A reticle support 28 is arranged in a reticle transfer path within the airtight chamber 36.

A reticle 23 to which a pellicle 24 (having a support frame 25 and a pellicle film 26 adhered to one end face of the support frame 25) is adhered is aligned and mounted at a predetermined position on the support 28 manually or by a reticle hand (not shown) or a transfer robot (not shown) outside the airtight chamber 36.

If necessary, the support 28 may have a suction groove for sucking and fixing the reticle 23. An alignment mechanism (not shown) for more precisely aligning the reticle 23 on the support 28 can be optionally arranged. This mechanism enables more strict alignment with the lid opening/closing mechanism of the pellicle support frame 25 (to be described later) and accurate opening/closing of lids ah and bh of the pellicle support frame 25.

Figure 6:
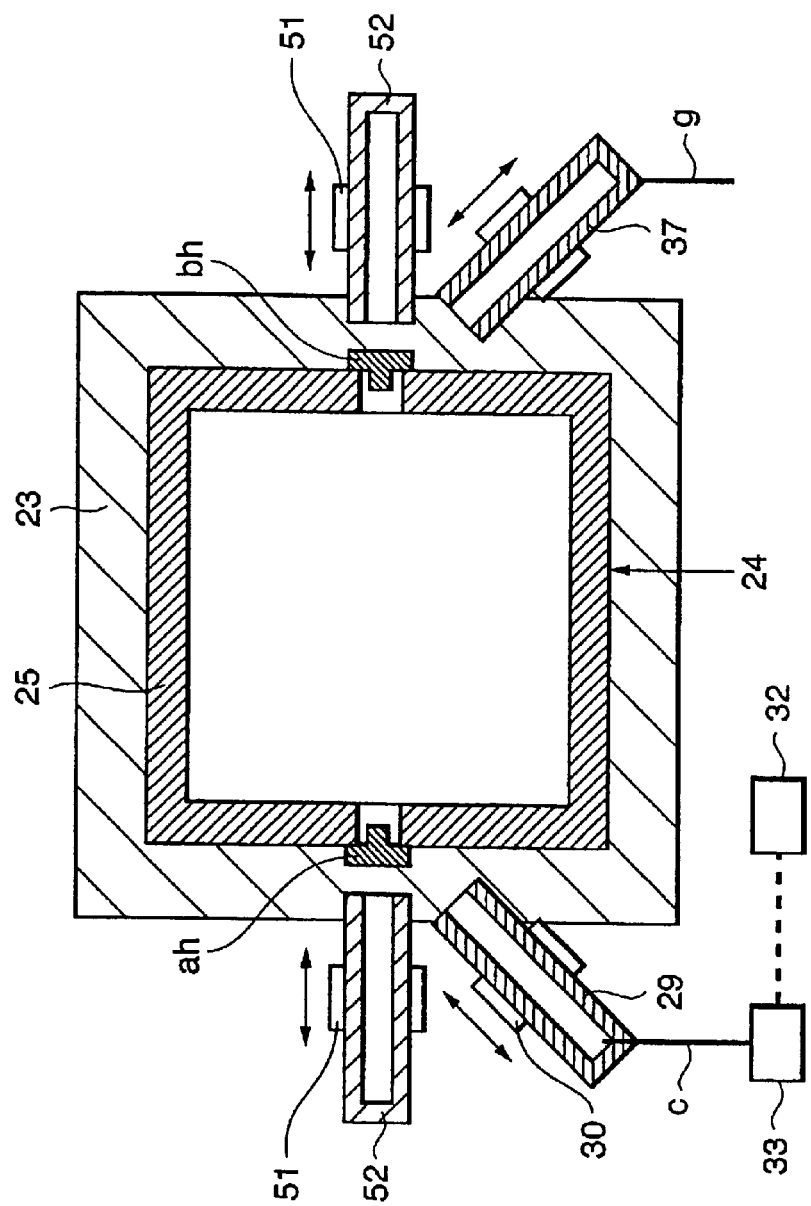
FIG. 6 is a schematic view when the section of FIG. 5 is viewed from below.

The alignment mechanism (not shown) further allows more strictly aligning an inert gas supply nozzle 29 and discharge nozzle 37 shown in FIG. 6 with the pellicle support frame 25, and minimizing the leakage of inert gas.

The pellicle support frame 25 of the pellicle 24 has an inert gas supply port a, the lid ah for opening/closing the supply port a, an inert gas discharge port b, and the lid bh for opening/closing the discharge port b. A lid suction nozzle 52 and lid suction nozzle proximity mechanism 51 are arranged as a pellicle support frame lid opening/closing mechanism at a predetermined interval from the lid ah for opening/closing the inert gas supply port a formed in the pellicle support frame 25.

The lid suction nozzle proximity mechanism 51 has a guide and driving portion movable in at least one direction. A driving device for driving the lid suction nozzle proximity mechanism 51 may be various motors, or a driving device using the gas pressure of a piston cylinder, bellofram cylinder, or the like as a driving source.

Figure 7A:
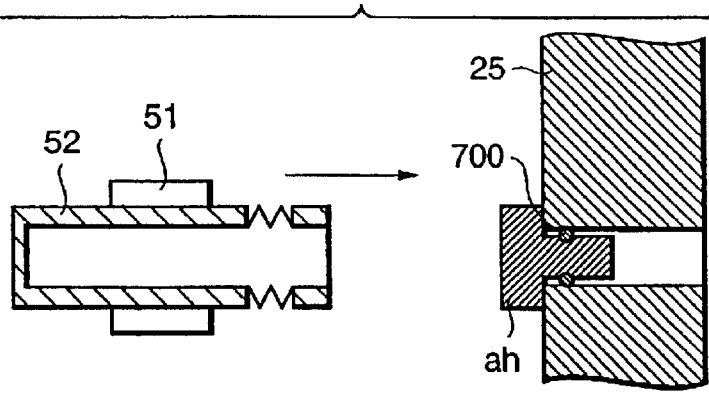
FIGS. 7A to 7C are schematic sectional views showing a mechanism and operation of opening/closing the lid of a pellicle support frame in the first embodiment of the present invention.
Figure 7B:
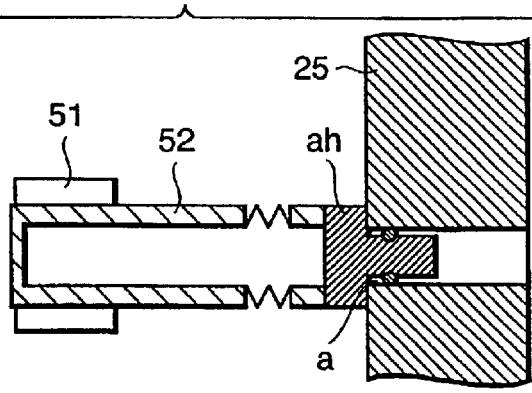
Figure 7C:
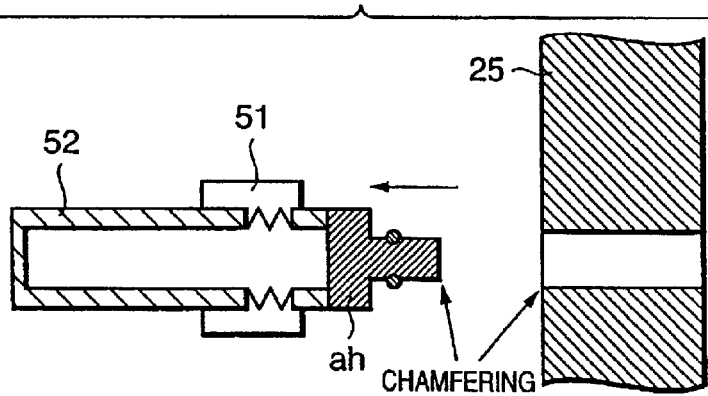

FIGS. 7A, 7B, and 7C sequentially show states in which the lid of the pellicle support frame lid opening/closing mechanism is opened.

In FIG. 7A, the lid ah is in contact with the pellicle support frame 25 via a seal member such as an O-ring 700. The O-ring 700 enables the lid ah to maintain airtightness, and the sliding resistance between the O-ring 700 and the pellicle support frame 25 prevents the lid ah from opening accidentally.

In FIG. 7B, the lid suction nozzle proximity mechanism 51 brings the lid suction nozzle 52 into tight contact with the lid ah, and the lid suction nozzle 52 sucks the lid ah. At least part of the lid suction nozzle 52 is made of an elastic member in order to keep the positions of the lid suction nozzle 52 and lid ah as close as possible. A slight positional shift between the lid suction nozzle 52 and the lid ah can be absorbed by the elastic member to reliably suck the lid ah. The lid suction nozzle 52 is connected to a vacuum device (not shown) via a 3-port valve (not shown), and can suck and release the lid ah.

In FIG. 7C, the lid ah sucked by the lid suction nozzle 52 is moved back and opened by the lid suction nozzle proximity mechanism 51.

The lid ah is closed by reverse procedures. The entrances of the inert gas supply port a and inert gas discharge port b and the ends of the lids ah and bh are desirably chamfered to smoothly open/close the lid ah.

A lid suction nozzle 52 and lid suction nozzle proximity mechanism 51 are also arranged as a pellicle support frame lid opening/closing mechanism at a predetermined interval from the lid bh for opening/closing the inert gas discharge port b formed in the pellicle support frame 25.

In the first embodiment, as shown in FIG. 5, a pellicle space impurity detection device 60 is so arranged as to sandwich the reticle 23 and pellicle 24. The pellicle space impurity detection device 60 is constituted by a light-projecting portion 61 and light-receiving portion 62. The light-projecting portion 61 is implemented by splitting a beam from a fluorine excimer laser serving as the light source of the exposure apparatus and guiding the beam through an optical fiber. In general, a fluorine excimer laser beam greatly attenuates within an optical fiber, and thus this embodiment uses a quartz hollow optical fiber with a high transmittance. The distal end of the optical fiber is equipped with an optical component (not shown) such as a collimator lens, which shapes light having passed through the optical fiber into narrow collimated light.

A window not covered with a chromium film is formed in a chromium pattern portion 63 where light having passed through the optical fiber impinges on the reticle 23. Light incident on the reticle 23 via the window reaches the light-receiving portion 62 without any influence of the chromium pattern. The light-receiving portion 62 is formed from a sensor such as a photodiode for measuring the light quantity. The pellicle space impurity detection device 60 according to the first embodiment calculates the oxygen and moisture concentrations by detecting the light quantity attenuated by oxygen and moisture within the pellicle space while a fluorine excimer laser beam emitted by the light-projecting portion 61 enters the light-receiving portion 62.

The photodiode of the light-receiving portion 62 used in the embodiment outputs a current value corresponding to an input light quantity. An initial light quantity without any attenuation in the pellicle space is measured in advance, and an output current value is represented by Ia. Letting Ib be the output current value for a light quantity attenuated by oxygen and moisture in the pellicle space, a transmittance T in the pellicle space is given by $T=Ib/Ia.$ Since the absorption coefficient of oxygen to 157-nm light is about 190 atm$^{-1}$cm$^{-1}$, an oxygen/moisture concentration N at one atmospheric pressure is calculated by $N=ln\ t/(-190 \times I),$ where I is the distance by which light has passed through the pellicle space. When a fluorine excimer laser beam emitted by the light-projecting portion 61 is parallel incident on the pellicle support frame 25 at an angle of θ with respect to the normal of a pellicle plane, and the height of the pellicle support frame 25 is represented by So, I=So/cos θ. From this, the oxygen/moisture concentration N is calculated by $N=ln(Ib/Ia)/(-190\times(So/\cos\theta)).$ In this manner, the oxygen/moisture concentration is calculated by detecting a light quantity attenuated by oxygen and moisture in the pellicle space while a fluorine excimer laser beam emitted by the light-projecting portion 61 enters the light-receiving portion 62.

The pellicle space impurity detection device 60 of the first embodiment uses, as detection light, light obtained by splitting and guiding a beam from a fluorine excimer laser serving as the light source of the exposure apparatus. The apparatus becomes compact and is advantageous in cost, compared to a case in which the same function is attached to an apparatus other than the exposure apparatus. The same function can be obtained even with the use of a 172-nm xenon excimer lamp as a projection lamp.

The present invention adopts a pellicle flexure measurement unit 70. The pellicle flexure measurement unit 70 is made up of a light-projecting portion 71 and light-receiving portion 72. In this embodiment, the light-projecting portion 71 also serves as the light-projecting portion 61 of the pellicle space impurity detection device 60. The light-receiving portion 72 receives light which is emitted by the light-projecting portion 71 and reflected by the pellicle surface. The light-receiving portion 72 is arranged on the same side as the light-projecting portion 71 with respect to the pellicle 24.

The light-receiving portion 72 is formed from a sensor such as a PSD (Position Sensitive Detector) or CCD for measuring the position of light. If the pellicle film 26 expands or contracts during purge with respect to the position of reflected light obtained when the pellicle film 26 is flat, the position of reflected light changes depending on the expansion or contraction. The flexure amount of the pellicle film 26 is calculated from the change amount. The pellicle film 26 vertically flexes with almost no inclination at the center of the pellicle.

A position 73 where light emitted by the light-projecting portion 71 is reflected by the pellicle film 26 is desirably a position where the pellicle surface hardly inclines regardless of the expansion or contraction of the pellicle film 26. The light-receiving portion 72 is desirably near the center of the pellicle.

The CCD of the light-receiving portion 72 used in this embodiment detects the position of light on the sensor. Let ΔX be the positional shift of reflected light on the sensor caused by vertical movement of the reflecting surface of the pellicle 24 when the pellicle film 26 actually flexes from an initial position measured in advance without any flexure of the pellicle film 26. If a fluorine excimer laser beam emitted by the light-projecting portion 71 is incident at an angle θ with respect to the normal of the pellicle plane, a flexure amount δ of the pellicle film 26 is given by $\delta = \Delta X \times \theta \cos.$ In this fashion, the flexure amount of the pellicle film 26 is calculated by measuring the positional shift, on the light-receiving portion 72 by the flexure of the pellicle film 26, of a fluorine excimer laser beam which is emitted the light-projecting portion 71 and reflected by the pellicle surface.

FIG. 6 is a view when the section of FIG. 5 is viewed from below. FIG. 6 is a schematic view showing the positional relationship between the reticle 23, the pellicle support frame 25, the lids ah and bh of the pellicle support frame 25, the lid opening/closing mechanism, the inert gas supply nozzle 29, and the discharge nozzle 37.

The inert gas supply nozzle 29 and a nozzle proximity mechanism 30 are arranged at a predetermined interval from the inert gas supply port a formed in the pellicle support frame 25. The discharge nozzle 37 is arranged on the discharge port b side symmetrically to the nozzle proximity mechanism 30. The nozzle proximity mechanism 30 has a guide and driving portion movable in at least one direction.

A driving device for driving the nozzle proximity mechanism 30 may be various motors, or a driving device using the gas pressure of a piston cylinder, bellofram cylinder, or the like, as a driving source. An inert gas supply device (not shown) is connected to one end of the inert gas supply nozzle 29 via a supply path c. A flow rate adjustment device 33, which adjusts the supply flow rate of inert gas, is inserted in the supply path c. In FIG. 6, reference numeral 32 denotes a control device which controls the flow rate adjustment device 33.

Processing of purging the pellicle space with inert gas will be explained with reference to FIGS. 5 and 6.

The reticle 23 to which the pellicle 24 is adhered is aligned and set at a predetermined position on the reticle support 28 manually or by a reticle hand or transfer robot (not shown). The lid suction nozzle 52 stands by at a predetermined position, and after or simultaneously when the reticle 23 is set on the reticle support 28, is brought into tight contact with the lid ah of the supply port a of the pellicle support frame 25 by the lid suction nozzle proximity mechanism 51.

The lid suction nozzle 52 sucks the lid ah of the supply port a of the pellicle support frame 25. As the lid suction nozzle proximity mechanism 51 moves apart from the pellicle 24, the lid ah of the supply port a of the pellicle support frame 25 is spaced apart from the pellicle 24, opening the supply port a of the pellicle support frame 25. Similarly, the inert gas discharge port b of the pellicle support frame 25 is opened.

The inert gas supply nozzle 29 and discharge nozzle 37 are aligned in tight contact with or at small intervals from the supply port a and discharge port b of the pellicle support frame 25 by the nozzle proximity mechanism 30. The supply nozzle 29 and discharge nozzle 37 are respectively connected to an inert gas supply device and inert gas discharge device (neither is shown) via the supply path c and a discharge path g. Inert gas is supplied into the pellicle space, while gas in the pellicle space is discharged outside the airtight chamber 36. The supplied inert gas is mixed with oxygen, moisture, and another impurity present in the pellicle space, and discharged outside from the discharge port b formed in the pellicle support frame 25.

The pellicle flexure measurement unit 70 always monitors the expansion or contraction of the pellicle 24 during supply of inert gas, and transmits the flexure amount to the control device 32. The control device 32 controls the flow rate adjustment device 33 so as to always keep the flexure amount smaller than a predetermined threshold of the flexure amount in order to prevent deformation or destruction of the pellicle film 26 and dropping from the pellicle support frame 25 and reticle 23, and so as to adjust the flow rate of inert gas supplied to the inert gas supply nozzle 29 or discharged from the discharge nozzle 37. The threshold of the flexure amount changes depending on the type and thickness of pellicle film 26. In general, the threshold is set to 1 mm or less for a general nitrocellulose pellicle film 26, and preferably about 0.3 mm. In the first embodiment, the threshold of the flexure amount can be set by a console (not shown), and can be set by the operator in accordance with the type of pellicle film 26.

The pellicle space impurity detection device 60 monitors oxygen and moisture concentrations in the pellicle space during supply of inert gas. Supply of inert gas stops when the oxygen and moisture concentrations in the pellicle space reach 1% or less, and preferably a predetermined threshold of about 1 to 100 ppm. This enables reliably purging the pellicle space at a predetermined inert gas concentration. The purge time need not be prolonged for higher reliability.

After the oxygen and moisture concentrations in the pellicle space become lower than the predetermined threshold, the inert gas supply nozzle 29 and discharge nozzle 37 retract from the vicinity of the pellicle 24. While sucking the lid ah, the lid suction nozzle 52 is moved to the pellicle support frame 25 by the lid suction nozzle proximity mechanism 51. The lid ah is inserted into the inert gas supply port a to close the inert gas supply port a.

The inert gas discharge port b of the pellicle support frame 25 is similarly closed. Since an equalizing hole (not shown) is formed in the pellicle 24, even the difference in atmospheric pressure between the purge space and the exposure space does not flex the pellicle film 26, realizing stable exposure.

The mechanism of opening the lid of the pellicle support frame 25 may be mounted on the reticle stage 1 or a pellicle inspection device. The equalizing hole formed in the pellicle 24 can prevent the flexure of the pellicle film during exposure or pellicle inspection. Even if the reticle is transferred and stocked outside the exposure apparatus after exposure, the pellicle space is almost tightly closed. This shortens a time required to reach a desirable concentration when inert gas purge is to be performed again in the exposure apparatus.

In FIG. 6, both the inert gas supply nozzle 29 and discharge nozzle 37 are arranged. Alternatively, either one of the nozzles may be arranged, and an opening may be formed in the pellicle support frame 25 instead of the other nozzle. In general, the pellicle support frame 25 has a rectangular flat shape with respect to a square flat reticle under restrictions in the exposure apparatus such as the layout of the pellicle support on the reticle stage.

These nozzles may be arranged on either a long or short side of the pellicle support frame 25. Depending on the shape of the pellicle support frame 25, the nozzles may be arranged at any one or all of four corners. A plurality of nozzles can advantageously shorten the purge time.

Dustproof filters may be attached inside the inert gas supply port a and discharge port b. The dustproof filters remove dust in a cleaner inert gas than a clean room atmosphere, and are lower in resistance than a dustproof filter attached to a conventional vent hole. These dustproof filters can, therefore, shorten the purge time. In addition, the dustproof property is higher than that of a valve attached to the pellicle support frame 25.

When the airtight chamber 36 shown in FIGS. 5 to 7 is used as a reticle load-lock chamber, the lid of the pellicle support frame 25 is opened at the same time as purge of the interior of the load-lock chamber with inert gas. The pellicle space can be purged with inert gas via the inert gas supply nozzle 29 or discharge nozzle 37.

After the interior of the load-lock chamber is purged with clean inert gas, the lid of the pellicle support frame 25 is opened to purge the pellicle space with inert gas. Entrance of a foreign matter in the clean room atmosphere into the pellicle space can be prevented. Compared to inert gas purge of the pellicle space at a place other than the transfer path, the standby time and reticle exchange time can be shortened in the whole exposure apparatus to increase the productivity.

The mechanism of opening/closing the lids ah and bh of the pellicle support frame 25, the inert gas supply nozzle 29, and discharge nozzle 37 can also be placed in the reticle stocker 18.

As for a reticle which is externally loaded into the exposure apparatus and temporarily stored in the reticle stocker without being immediately exposed, inert gas purge of the pellicle space is not performed in the reticle load-lock chamber. After a reticle is loaded into a predetermined slot where the nozzles of the reticle stocker are arranged, inert gas purge of the pellicle space is executed in the stocker. A more sufficient purge time can be ensured, and the inert gas concentration can be kept at a lower level in the pellicle space. Moreover, the inert gas purge time can be shortened in the reticle load-lock chamber.

The place where the mechanism of opening/closing the lids ah and bh of the pellicle support frame 25, the inert gas supply nozzle 29, and discharge nozzle 37 are arranged is not limited to the reticle stage 1, reticle stocker 18, and reticle load-lock chamber. The mechanism and nozzles can be arranged in the foreign matter inspection device 22 or in a reticle transfer path within the airtight chamber 36.

If the mechanism and nozzles are arranged in the reticle transfer path, the transfer time can be shortened in the overall exposure apparatus to increase the productivity. In place of one arrangement place, the mechanism and nozzles can be arranged at a plurality of portions to automatically select and execute inert gas purge at an optimal place in accordance with the reticle use purpose.

Second Embodiment

In the first embodiment of the present invention, the lids ah and bh of the inert gas supply port a and discharge port b of the pellicle support frame 25 are held by the sliding resistance of a seal member such as the O-ring 700. It is preferable to adopt a structure which prevents dust generated by sliding in opening/closing the lid from entering the pellicle space.

Figure 8A:
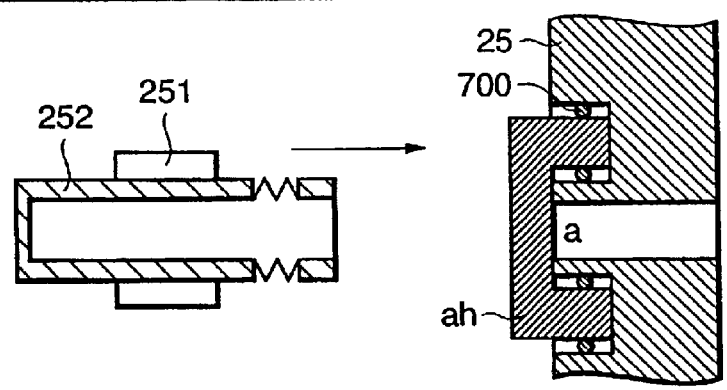
FIGS. 8A to 8C are schematic sectional views showing a mechanism and operation of opening/closing the lid of the pellicle support frame in the second embodiment of the present invention.
Figure 8B:
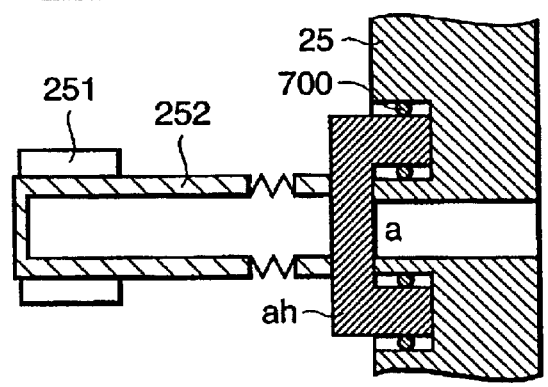
Figure 8C:
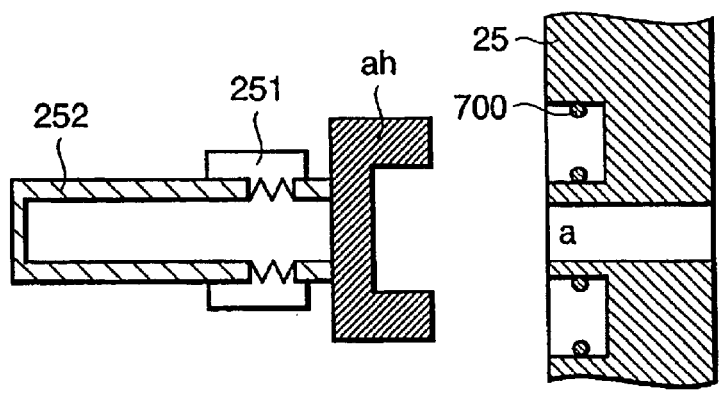

FIGS. 8A to 8C are schematic views showing a mechanism of opening/closing a lid ah of a pellicle support frame 25 in a purge mechanism of purging the pellicle space with inert gas according to the second embodiment of the present invention. This embodiment provides a structure which prevents dust generated by sliding in opening/closing the lid ah from entering the pellicle space.

FIGS. 8A, 8B, and 8C sequentially show states in which the lid of the pellicle support frame lid opening/closing mechanism is opened. The pellicle support frame 25 of a pellicle 24 has an inert gas supply port a, and the lid ah for opening/closing the supply port a. A lid suction nozzle 252 and lid suction nozzle proximity mechanism 251 are arranged as a pellicle support frame lid opening/closing mechanism at a predetermined interval from the lid ah for opening/closing the inert gas supply port a formed in the pellicle support frame 25. The lid suction nozzle proximity mechanism 251 has a guide and driving portion movable in at least one direction.

In FIG. 8A, the lid ah is in contact with the pellicle support frame 25 via a seal member such as an O-ring 700. The O-ring 700 enables the lid ah to maintain airtightness, and the sliding resistance between the O-ring 700 and the pellicle support frame 25 prevents the lid ah from opening accidentally. The sliding portion for holding the lid ah is arranged outside the inert gas supply port formed in the pellicle support frame 25, and dust generated in opening/closing does not enter the inert gas supply port a.

In FIG. 8B, the lid suction nozzle proximity mechanism 251 brings the lid suction nozzle 252 into tight contact with the lid ah, and the lid suction nozzle 252 sucks the lid ah. At least part of the lid suction nozzle 252 is made of an elastic member in order to keep the positions of the lid suction nozzle 252 and lid ah as close as possible. A slight positional shift between the lid suction nozzle 252 and the lid ah can be absorbed by the elastic member to reliably suck the lid ah. The lid suction nozzle 252 is connected to a vacuum device (not shown) via a 3-port valve (not shown), and can suck and release the lid ah.

In FIG. 8C, the lid ah is opened by the lid suction nozzle proximity mechanism 251. At this time, dust generated by sliding between the lid ah and the O-ring 700 does not enter the inert gas supply port a and the pellicle space. The lid ah is closed by reverse procedures. The entrances of the inert gas supply port a and an inert gas discharge port b and the ends of the lid ah and a lid bh are desirably chamfered to smoothly open/close the lid ah.

A lid suction nozzle and lid suction nozzle proximity mechanism are also arranged as a pellicle support frame lid opening/closing mechanism at a predetermined interval from the lid bh for opening/closing the inert gas discharge port b formed in the pellicle support frame 25. The lid bh is opened/closed by the same procedures.

Third Embodiment

Figure 9A:
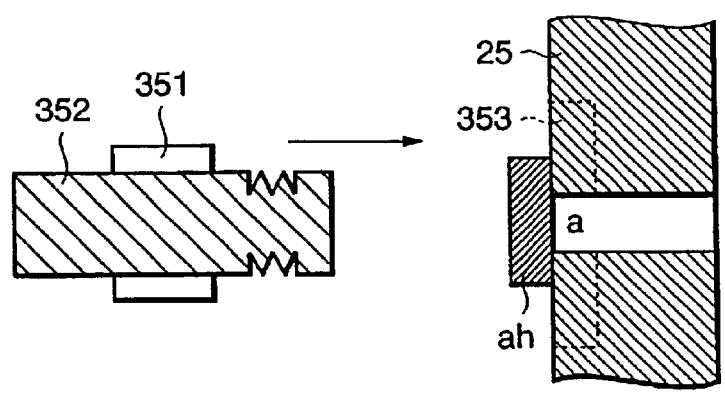
FIGS. 9A to 9C are schematic sectional views showing a mechanism and operation of opening/closing the lid of the pellicle support frame in the third embodiment of the present invention.
Figure 9B:
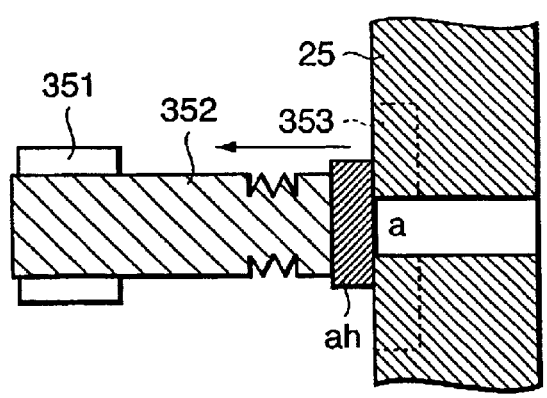
Figure 9C:
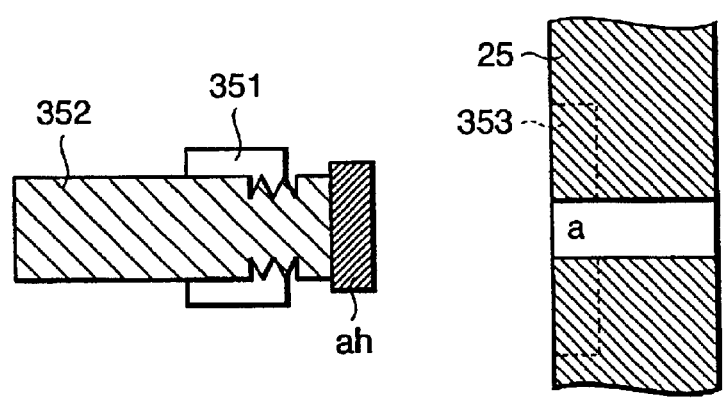

FIGS. 9A to 9C are schematic views showing a mechanism of opening/closing the lid of a pellicle support frame 25 in a purge mechanism of purging the pellicle space with inert gas according to the third embodiment of the present invention. This embodiment comprises a mechanism not accompanied with sliding in opening/closing a lid ah, and dust does not enter the pellicle space in opening/closing the lid ah. The third embodiment adopts a structure using a magnet to hold the lid.

The pellicle support frame 25 of a pellicle 24 has an inert gas supply port a, and the lid ah for opening/closing the supply port a. A magnet 353 is buried in the pellicle support frame 25. The lid ah is made of iron and undergoes chemical nickel plating in consideration of the influence of degassing to a purge area. An electromagnet 352 and electromagnet proximity mechanism 351 are arranged as a pellicle support frame lid opening/closing mechanism at a predetermined interval from the lid ah for opening/closing the inert gas supply port a formed in the pellicle support frame 25.

The electromagnet 352 has a coil (not shown), and generates a desired electromagnetic force by supplying a current to the coil. The electromagnet 352 is connected to a current generation device (not shown) via a switch. The electromagnet proximity mechanism 351 has a guide and driving portion movable in at least one direction.

In FIG. 9A, the lid ah is fixed to the pellicle support frame 25 via the magnet 353.

In FIG. 9B, the electromagnet proximity mechanism 351 brings the electromagnet 352 into tight contact with the lid ah. At least part of the electromagnet 352 is made of an elastic member in order to keep the positions of the lid suction nozzle 252 and lid ah as close as possible.

A slight positional shift between the electromagnet 352 and the lid ah can be absorbed by the elastic member to reliably bring the electromagnet 352 into tight contact with the lid ah. After the electromagnet 352 and lid ah come into tight contact with each other, a current is supplied to the coil of the electromagnet 352 to generate a magnetic force. A preset current is supplied such that the magnetic force becomes larger than that of the magnet 353 buried in the pellicle support frame 25.

If the magnetic force of the electromagnet 352 becomes larger than that of the magnet 353 buried in the pellicle support frame 25, the lid ah is attracted to the electromagnet 352 from the pellicle support frame 25.

In FIG. 9C, the lid ah attracted to the electromagnet 352 is separated from the pellicle support frame 25 of the pellicle 24 by the electromagnet proximity mechanism 351.

The lid ah is fixed to the pellicle support frame 25 by reverse procedures. Since the mechanism of opening/closing the lid ah of the inert gas discharge line 35 in the third embodiment does not have any portion which slides along with opening/closing the lid ah, dust does not enter the pellicle space in opening/closing the lid ah.

An electromagnet and electromagnet proximity mechanism are also arranged as a pellicle support frame lid opening/closing mechanism at a predetermined interval from a lid bh for opening/closing an inert gas discharge port b formed in the pellicle support frame 25. The lid bh is opened/closed by the same procedures as those of the lid ah.

Fourth Embodiment

Figure 10A:
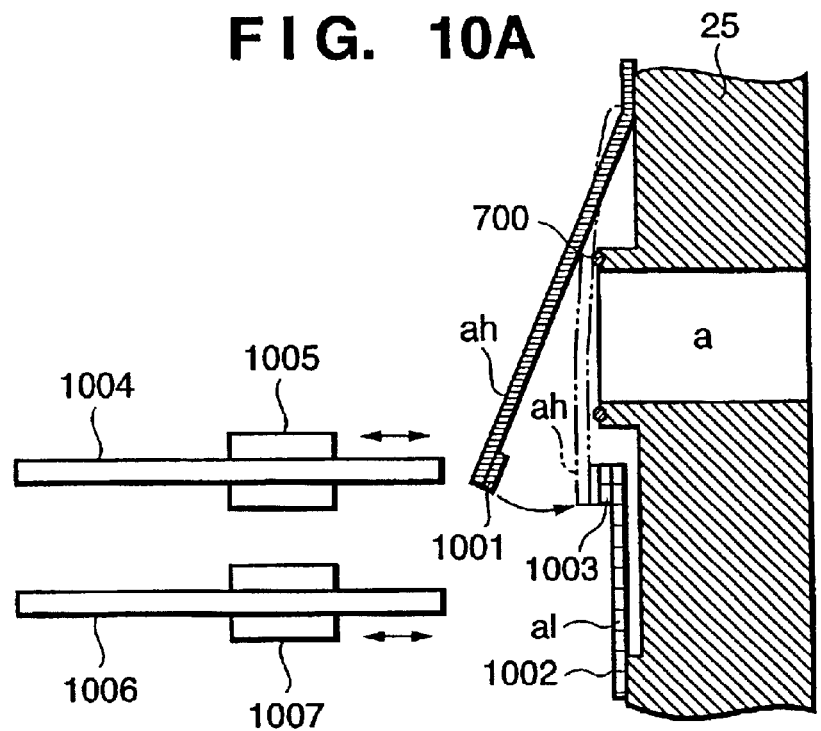
FIGS. 10A and 10B are schematic sectional views showing a mechanism of opening/closing the lid of the pellicle support frame in the fourth embodiment of the present invention.
Figure 10B:
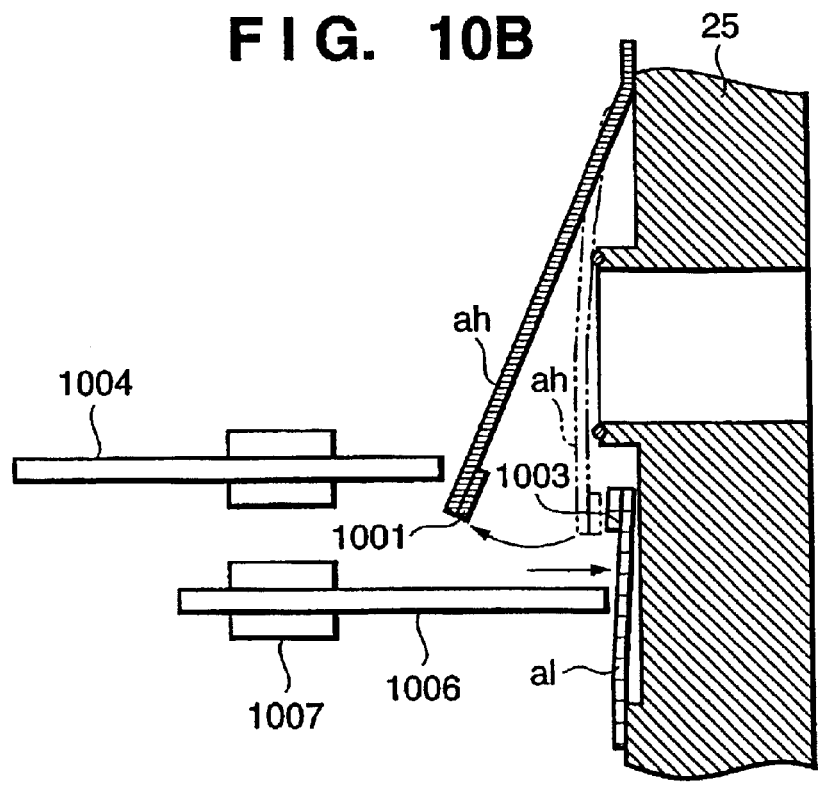

FIGS. 10A and 10B are schematic views showing another example using a magnet to hold a lid according to the fourth embodiment. An inert gas supply port a is formed in advance in a pellicle support frame 25 of a pellicle 24.

In FIG. 10A, a lid ah for opening/closing the supply port a is an elastic member such as a leaf spring, one end of which is fixed to the pellicle support frame 25 by a screw, adhesion, or the like. The leaf spring is bent near the fixed portion and does not contact the inert gas supply port a. A magnet 1001 is fixed to the distal end of the leaf spring opposite to the fixed portion by a screw, adhesion, or the like.

A seal member such as an O-ring 700 is formed around the inert gas supply port a. A lock mechanism al is arranged on a side opposite to the fixed portion of the lid ah via the inert gas supply port a.

The lock mechanism al is made up of an elastic member 1002 such as a leaf spring, and a magnet 1003 at the distal end of the elastic member 1002. One end of the lock mechanism al is fixed to the pellicle support frame 25 by a screw, adhesion, or the like. A lid press portion 1004 and lid press portion proximity mechanism 1005 are arranged as a pellicle support frame lid opening/closing mechanism at a predetermined interval from the lid ah.

The lid press portion proximity mechanism 1005 has a guide and driving portion movable in at least one direction.

Further, a lock press portion 1006 and lock press portion proximity mechanism 1007 are arranged as a pellicle support frame lid opening/closing mechanism at a predetermined interval from the lock mechanism a1. The lock press portion proximity mechanism 1007 has a guide and driving portion movable in at least one direction.

An operation of closing the lid ah will be explained with reference to FIG. 10A.

The lid ah indicated by the solid line in FIG. 10A is open. From this state, the lid press portion proximity mechanism 1005 moves the lid press portion 1004 toward the pellicle support frame 25. While elastically deforming the lid ah, the lid press portion 1004 brings the magnet 1001 at the distal end of the lid ah into tight contact with the magnet 1003 of the lock mechanism a1. At this time, the magnet 1001 at the distal end of the lid ah and the magnet 1003 of the lock mechanism a1 attract each other by their magnetic forces. Even after the lid press portion proximity mechanism 1005 retraces the lid press portion 1004 from the pellicle side, the lid ah is kept closed.

An operation of opening the lid ah will be explained with reference to FIG. 10B. The lock press portion proximity mechanism 1007 moves the lock press portion 1006 toward the pellicle support frame 25. The lock press portion 1006 comes into contact with the lock mechanism a1, and elastically deforms the lock mechanism a1 to separate the magnet 1001 at the distal end of the lid ah from the magnet 1003 of the lock mechanism a1. Then, the lid ah moves to recover from the deformation by its own elasticity, and opens. After the lid ah opens, the lock press portion proximity mechanism 1007 moves the lock press portion 1006 to the initial position.

Since the mechanism of opening/closing the lid ah of the pellicle support frame 25 in the fourth embodiment does not have any portion which slides along with opening/closing the lid ah, dust does not enter the pellicle space in opening/closing the lid ah.

The magnets are respectively attached to the distal ends of the lid ah and lock mechanism a1 in this embodiment. Alternatively, either one of the distal ends may be formed from a magnet, whereas the other may be made of a material such as iron which is attracted to the magnet. A lid bh for opening/closing an inert gas discharge port b formed in the pellicle support frame 25 is also opened/closed by the same procedures.

Fifth Embodiment

Figure 11:
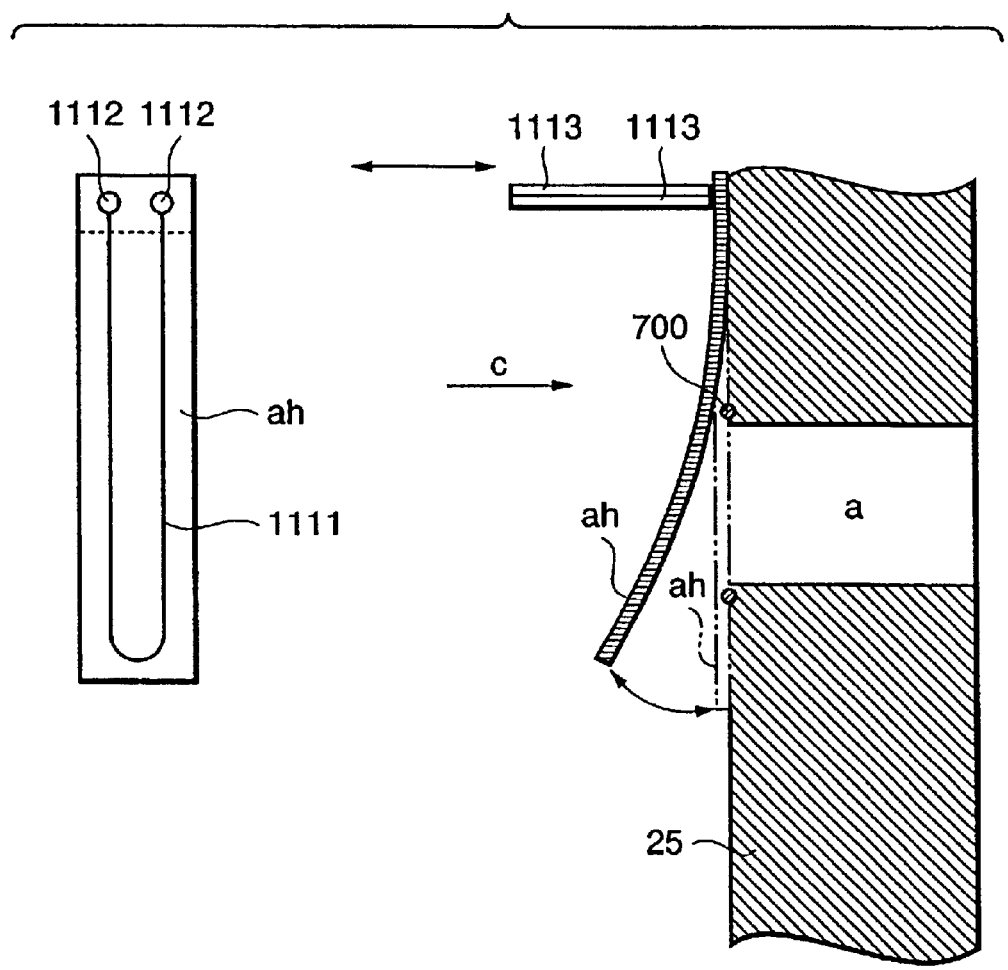

FIG. 11 is a view showing an example using a shape memory alloy or bimetal to hold a lid according to the fifth embodiment. An inert gas supply port a is formed in advance in a pellicle support frame 25 of a pellicle 24.

A lid ah for opening/closing the inert gas supply port a on the right side of FIG. 11 is made of a shape memory alloy or bimetal. One end of the lid ah is fixed to the pellicle support frame 25 by a screw, adhesion, or the like. In general, the lid ah is flat and closed, as indicated by a chain double-dashed line on the right side of FIG. 11.

The lid ah has a wiring line 1111 as shown on the left side of FIG. 11, and two electrode receivers 1112 are arranged at the fixing portion.

Two electrodes 1113 connected to a current generation device (not shown) via a switch are arranged as a pellicle support frame lid opening/closing mechanism at a predetermined interval from the fixing portion of the lid ah. After a reticle is set on the reticle support, an electrode proximity mechanism (not shown) aligns the two electrodes 1113 in contact with the electrode receivers 1112 of the lid ah. To open the lid ah, the electrodes are energized.

Then, the temperature of the lid ah rises by the resistance of the lid ah, and the lid ah deforms and opens as shown on the right side of FIG. 11. To close the lid ah, energization stops. Then, the lid ah is cooled by an ambient atmosphere and returns to the flat shape again. Instead of energizing the lid ah, the lid ah may be warmed, deformed, and opened. This is achieved by a method of arranging a heat source near the lid ah in order to transmit radiant heat to the lid ah, or a method using a nozzle for blowing hot air in order to transmit heat to the lid ah by convection.

As described above, the mechanism of opening/closing the lid ah of the pellicle support frame 25 in the fifth embodiment does not have any portion which slides along with opening/closing the lid ah, and thus dust does not enter the pellicle space in opening/closing the lid ah. A lid bh for opening/closing an inert gas discharge port b formed in the pellicle support frame 25 is also opened/closed by the same procedures.

Sixth Embodiment

Figure 12:
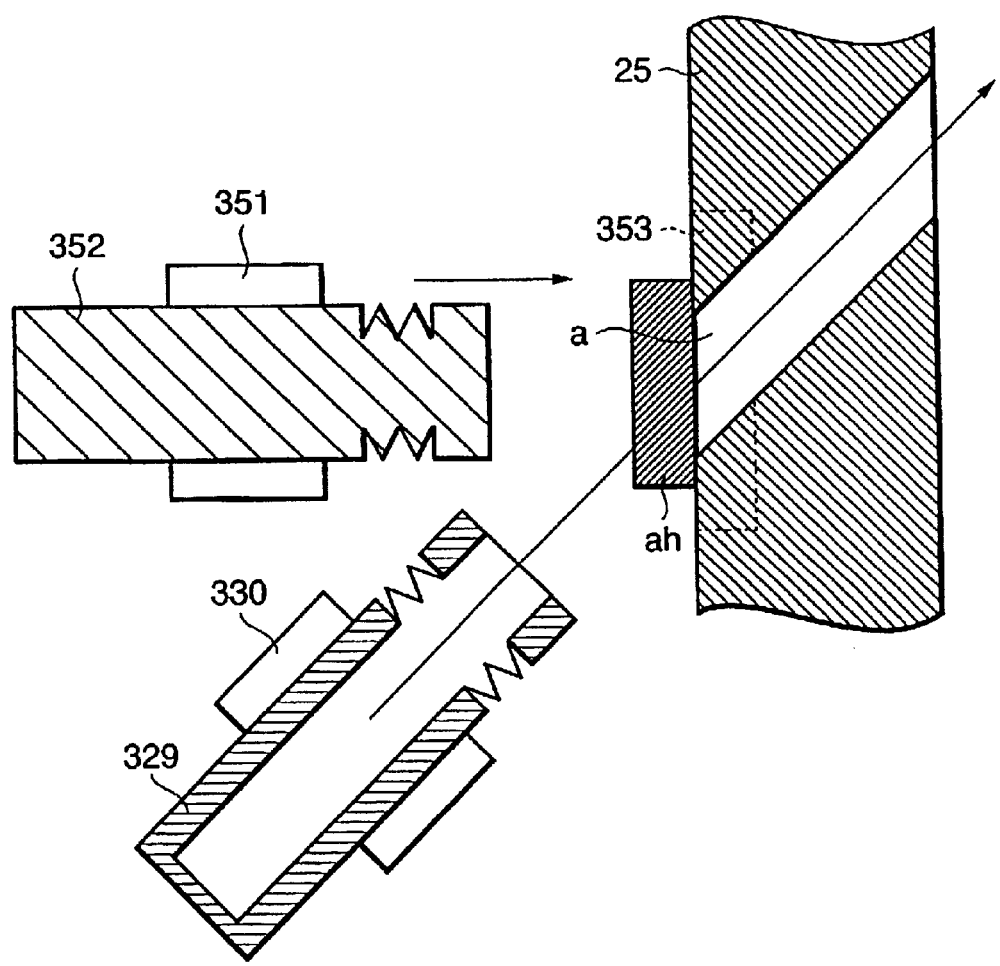
FIG. 12 is a sectional view showing an example of a nozzle in an inert gas purge apparatus in the sixth embodiment of the present invention.

FIG. 12 is a view showing an example concerning the layout of an inert gas supply nozzle or discharge nozzle according to the sixth embodiment of the present invention.

In FIG. 12, a supply nozzle 329 and nozzle proximity mechanism 330 are arranged diagonally to a pellicle support frame 25 such that the injection direction of inert gas supplied from the inert gas supply nozzle 329 and an inert gas supply port a are substantially aligned.

In the sixth embodiment, gas injected from the inert gas supply nozzle 329 can enter the pellicle space with little resistance. The inert gas purge efficiency can be increased, and the purge time can be shortened.

Seventh Embodiment

Figure 13:
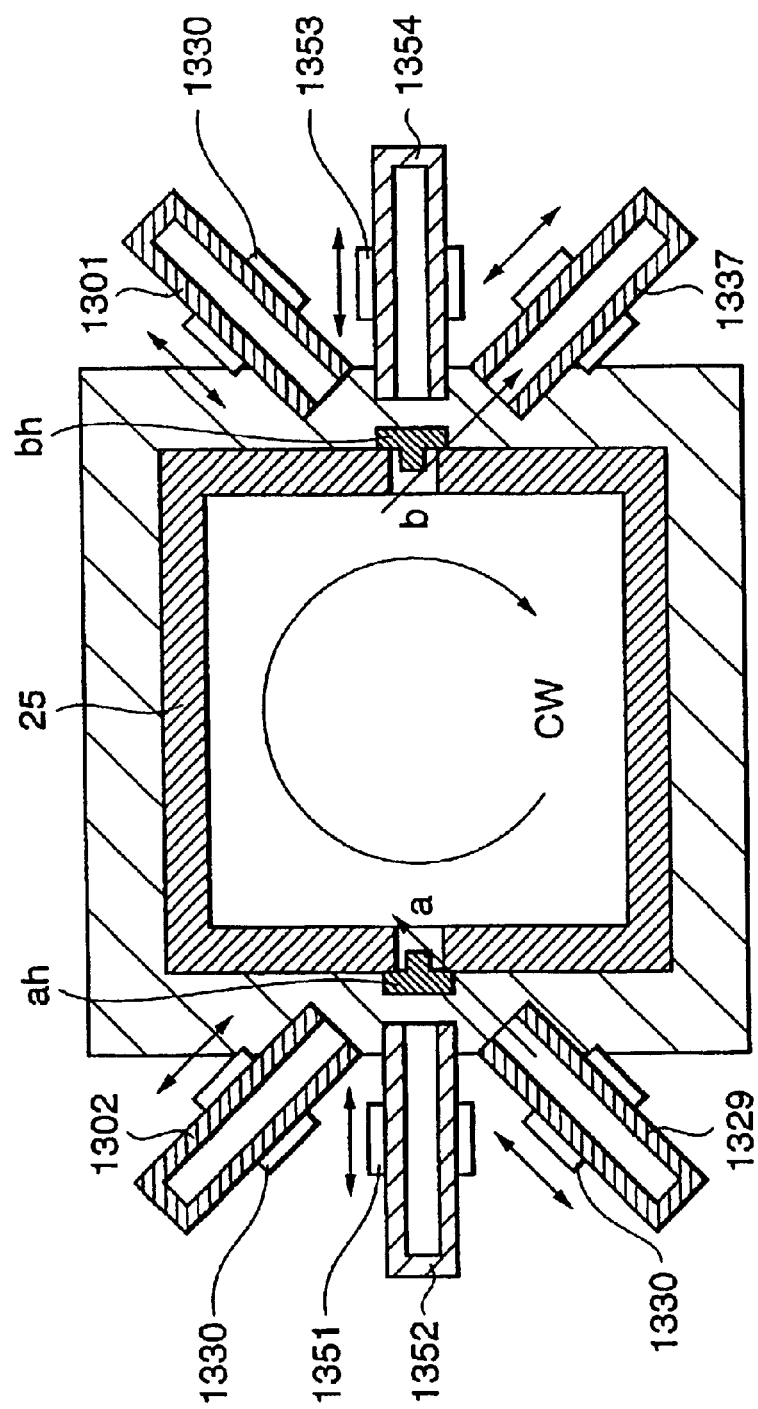
FIG. 13 is a view showing an example of a nozzle in an inert gas purge apparatus in the seventh embodiment of the present invention.

FIG. 13 is a view showing an example concerning the layout of an inert gas supply nozzle or discharge nozzle according to the seventh embodiment of the present invention. In FIG. 13, two inert gas supply nozzles 1329 and 130 and discharge nozzles 1337 and 1301 are diagonally arranged and face each other via a pellicle support frame 25. Lid opening/closing mechanisms 1351, 1352, 1353, and 1354 for the pellicle support frame 25 are interposed between the respective nozzles.

The inert gas supply nozzles 1329 and 130 and discharge nozzles 1337 and 1301 are aligned in tight contact with or at small intervals from a supply port a and discharge port b of the pellicle support frame 25 by proximity mechanisms 1330 and 1354. The supply nozzles 1329 and 130 and discharge nozzles 1337 and 1301 are respectively connected to an inert gas supply device and inert gas discharge device (neither is shown) via a supply path and discharge path (neither is shown).

Lids ah and bh of the pellicle support frame 25 are opened by the same procedures as those of the first embodiment. The supply nozzle 1329 supplies inert gas into the pellicle space, while the discharge nozzle 1337 discharges gas in the pellicle space outside the airtight chamber. The supplied inert gas is mixed with oxygen, moisture, and another impurity present in the pellicle space, and discharged outside from the discharge port b formed in the pellicle support frame 25.

At this time, a flow in a direction cw is generated in the pellicle space. To purge the pellicle space within a short time, spread of inert gas must be promoted. If inert gas is spread by only the same flow, gas stagnates at the inner corner or center of the pellicle support frame 25, delaying spread of inert gas in the pellicle space.

In the seventh embodiment, the flow direction of inert gas is switched during purge in order to eliminate stagnation of inert gas at the inner corner or center of the pellicle support frame 25 and to promote the spread of inert gas in the pellicle space.

More specifically, the pellicle space is purged by the inert gas supply nozzle 1329 and discharge nozzle 1337 up to the middle of purge. Preferably, upon the elapse of almost half the purge time, supply and discharge of inert gas by the inert gas supply nozzle 1329 and discharge nozzle 1337 stop. At the same time, inert gas is supplied into the pellicle space by the inert gas supply nozzle 1302, and gas in the pellicle space is discharged outside the airtight chamber by the discharge nozzle 1301.

The flow in the pellicle space is switched to a direction opposite to the direction cw. Until the flow is switched, a turbulent flow occurs in the pellicle space to promote spread of inert gas.

Eighth Embodiment

In the first embodiment, the flexure of a pellicle is calculated from a laser-reflected position. The flexure of a pellicle can also be measured by a measurement unit using a non-contact displacement sensor such as a limited-reflection photoelectric sensor, electrostatic capacitance sensor, or ultrasonic displacement sensor.

Figure 14:
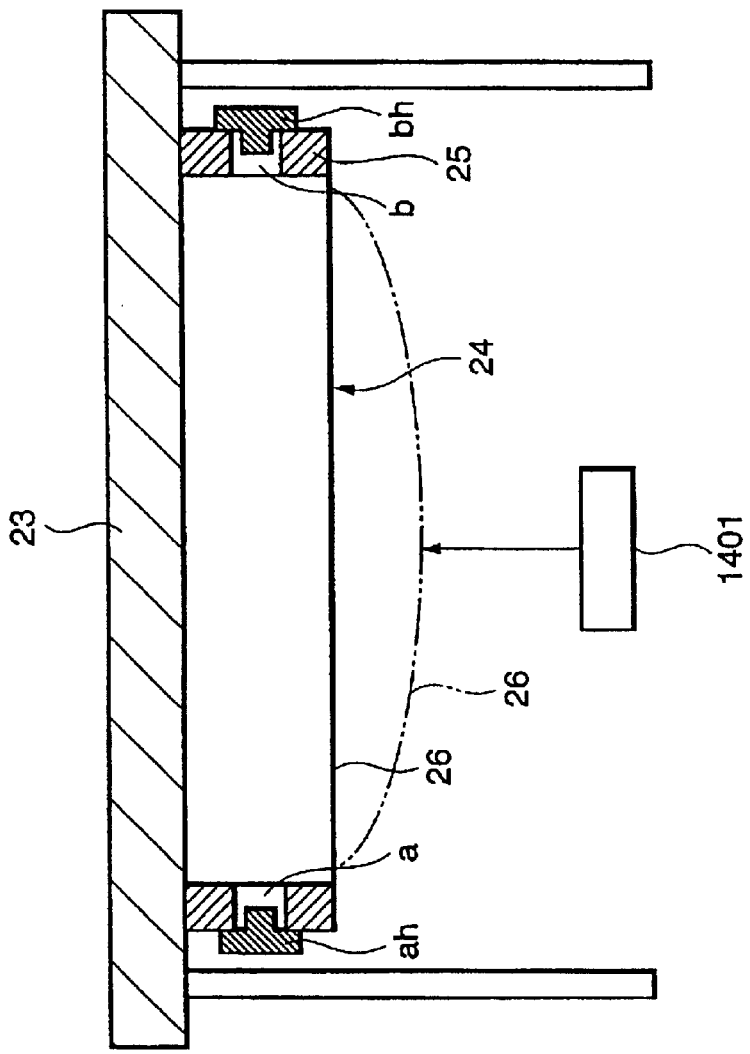
FIG. 14 is a view showing an example of a pellicle flexure measurement unit in an inert gas purge apparatus in the eighth embodiment of the present invention.

FIG. 14 is a view showing an example of a pellicle flexure measurement unit according to the eighth embodiment of the present invention. A sensor 1401 which measures the flexure of a pellicle film 26 is arranged below the center of the pellicle.

When the sensor 1401 which measures the flexure of a pellicle film 26 is a limited-reflection photoelectric sensor, the sensor is arranged in accordance with the detection position of the sensor. If the pellicle film 26 expands to reach the flexure threshold of the pellicle film 26, this is detected by the limited-reflection photoelectric sensor 1401.

When the sensor 1401 which measures the flexure of a pellicle film 26 is an electrostatic capacitance sensor or ultrasonic displacement sensor, a distance corresponding to a change in the vertical position of the pellicle film 26 can be detected. Even if the pellicle film 26 expands or contracts, the flexure amount can be detected.

When the pellicle film 26 flexes, the vertical displacement is largest at the center of the pellicle. Any of the sensors is desirably arranged near the center of the pellicle 24.

Embodiment of a Semiconductor Production System

A production system for a semiconductor device (e.g., a semiconductor chip such as an IC or LSI, a liquid crystal panel, CCD, a thin-film magnetic head, micromachine, or the like) using the exposure apparatus according to the present will be exemplified. A trouble remedy or periodic maintenance of a manufacturing apparatus installed in a semiconductor manufacturing factory, or maintenance service such as software distribution is performed by using a computer network outside the manufacturing factory.

Figure 15:
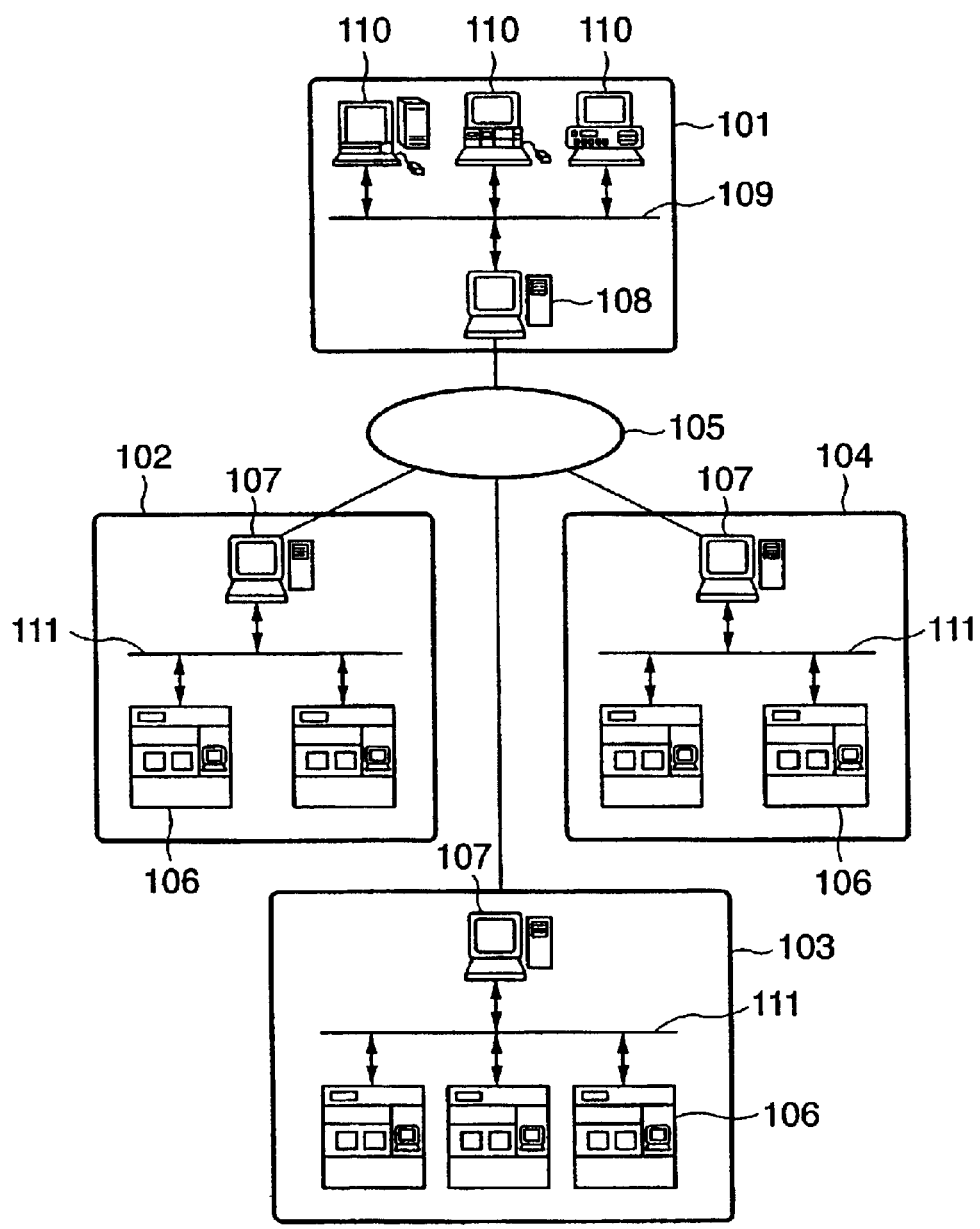
FIG. 15 is a view showing the concept of a semiconductor device production system using an exposure apparatus according to the present invention when viewed from a given angle.

FIG. 15 shows the overall system cut out at a given angle. In FIG. 15, reference numeral 101 denotes a business office of a vendor (e.g., an apparatus supply manufacturer) which provides a semiconductor device manufacturing apparatus. Examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus and an etching apparatus, an annealing apparatus, a film formation apparatus, a planarization apparatus, and the like) and post-process apparatuses (e.g., an assembly apparatus, an inspection apparatus, and the like).

The business office 101 comprises a host management system 108 for providing a maintenance database for the manufacturing apparatus, a plurality of operation terminal computers 110, and a LAN (Local Area Network) 109 which connects the host management system 108 and computers 110 to build an intranet. The host management system 108 has a gateway for connecting the LAN 109 to Internet 105 serving as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (pre-process factory, post-process factory, and the like). Each of the factories 102 to 104 is equipped with a plurality of manufacturing apparatuses 106, a LAN (Local Area Network) 111 which connects these apparatuses 106 to construct an intranet, and a host management system 107 serving as a monitoring apparatus for monitoring the operation status of each manufacturing apparatus 106.

The host management system 107 in each of the factories 102 to 104 has a gateway for connecting the LAN 111 in the factory to the Internet 105 serving as an external network of the factory. Each factory can access the host management system 108 of the vendor 101 from the LAN 111 via the Internet 105. The security function of the host management system 108 authorizes access of only a limited user.

More specifically, the factory can notify the vendor via the Internet 105 of status information (e.g., the symptom of a manufacturing apparatus in trouble) representing the operation status of each manufacturing apparatus 106. Also, the factory can receive, from the vendor, response information (e.g., information designating a remedy against the trouble, or remedy software or data) corresponding to the notification, or maintenance information such as the latest software or help information.

Data communication between the factories 102 to 104 and the vendor 101 and data communication via the LAN 111 in each factory adopt a communication protocol (TCP/IP) generally used in the Internet.

Instead of using the Internet as an external network of the factory, a high-security dedicated network (e.g., an ISDN), which inhibits access of a third party, can be adopted.

Also, the user may construct a database in addition to the one provided by the vendor and set the database on an external network, and the host management system may authorize access to the database from a plurality of user factories.

Figure 16:
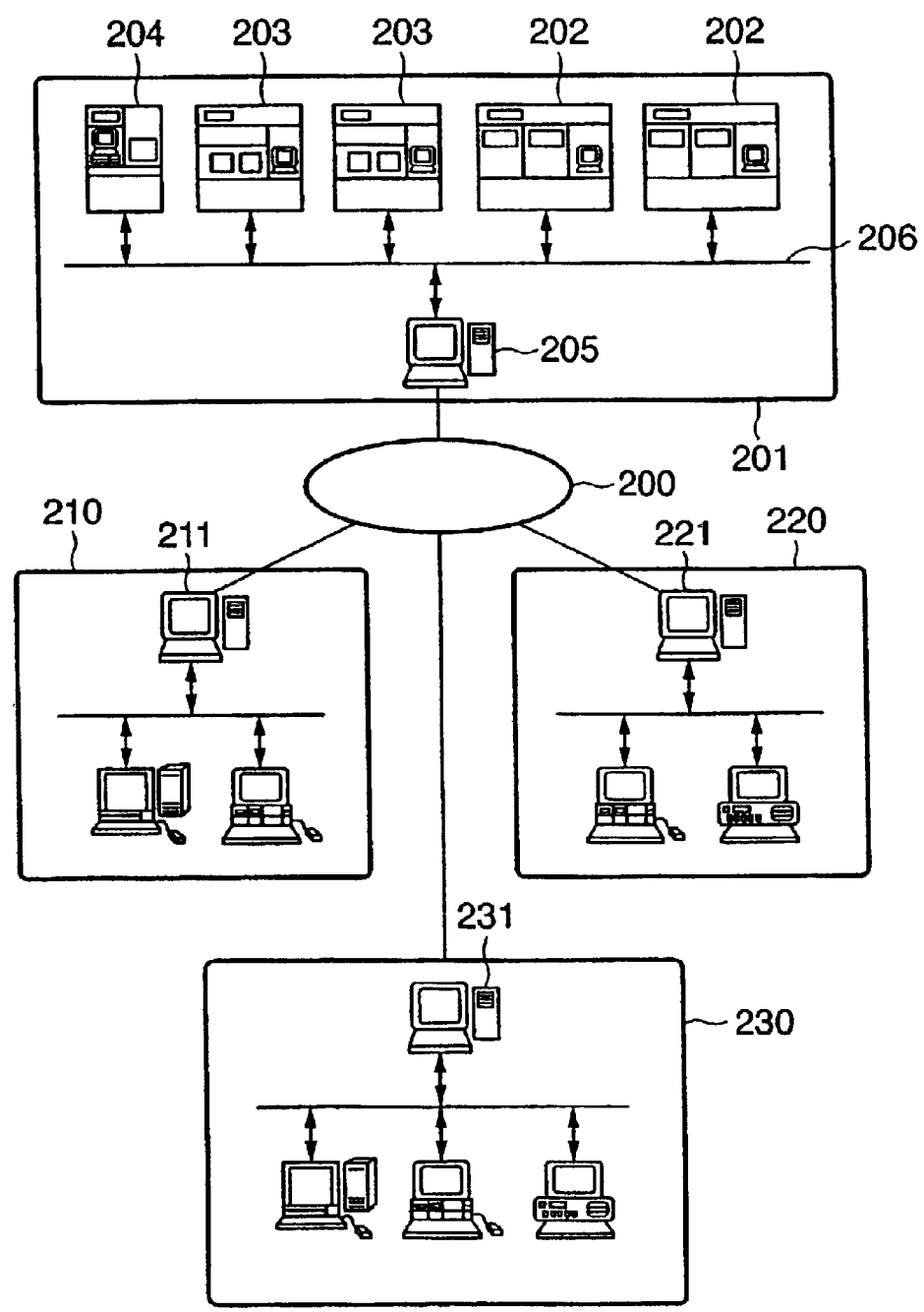
FIG. 16 is a view showing the concept of the semiconductor device production system using the exposure apparatus according to the present invention when viewed from another angle.

FIG. 16 is a view showing the concept of the overall system of this embodiment that is cut out at a different angle from FIG. 15. In the above example, a plurality of user factories having manufacturing apparatuses and the management system of the manufacturing apparatus vendor are connected via an external network, and production management of each factory or information of at least one manufacturing apparatus is communicated via the external network.

In the example of FIG. 16, a factory having manufacturing apparatuses of a plurality of vendors and the management systems of the vendors for these manufacturing apparatuses are connected via the external network of the factory, and maintenance information of each manufacturing apparatus is communicated.

In FIG. 16, reference numeral 201 denotes a manufacturing factory of a manufacturing apparatus user (semiconductor device manufacturer) where manufacturing apparatuses for performing various processes, e.g., an exposure apparatus 202, a resist processing apparatus 203, and a film formation apparatus 204 are installed in the manufacturing line of the factory.

FIG. 16 shows only one manufacturing factory 201, but a plurality of factories are networked in practice. The respective apparatuses in the factory are connected to a LAN 206 to build an intranet, and a host management system 205 manages the operation of the manufacturing line.

The business office of vendors (apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above.

The host management system 205 for managing the apparatuses in the manufacturing factory of the user, and the management systems 211, 221, and 231 of the vendors for the respective apparatuses are connected via the Internet or dedicated network serving as an external network 200.

If trouble occurs in any one of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server.

The network access software includes a dedicated or general-purpose web browser, and provides a user interface having a window as shown in FIG. 17 on the display. While referring to this window, the operator who manages manufacturing apparatuses in each factory inputs, in input items on the windows, pieces of information such as the type of manufacturing apparatus 401, serial number 40, subject of trouble 403, occurrence date 404, degree of urgency 405, symptom 406, remedy 407, and progress 408.

The pieces of input information are transmitted to the maintenance database via the Internet, and appropriate maintenance information is sent back from the maintenance database and displayed on the display. The user interface provided by the web browser realizes hyperlink functions 410 to 412, as shown in FIG. 17. This allows the operator to access detailed information of each item, receive the latest-version software to be used for a manufacturing apparatus from a software library provided by a vendor, and receive an operation guide (help information) as a reference for the operator in the factory.

The maintenance information provided by the maintenance database also includes information about the present invention described above. The software library also provides the latest-version software for implementing the features of the present invention.

Figure 18:
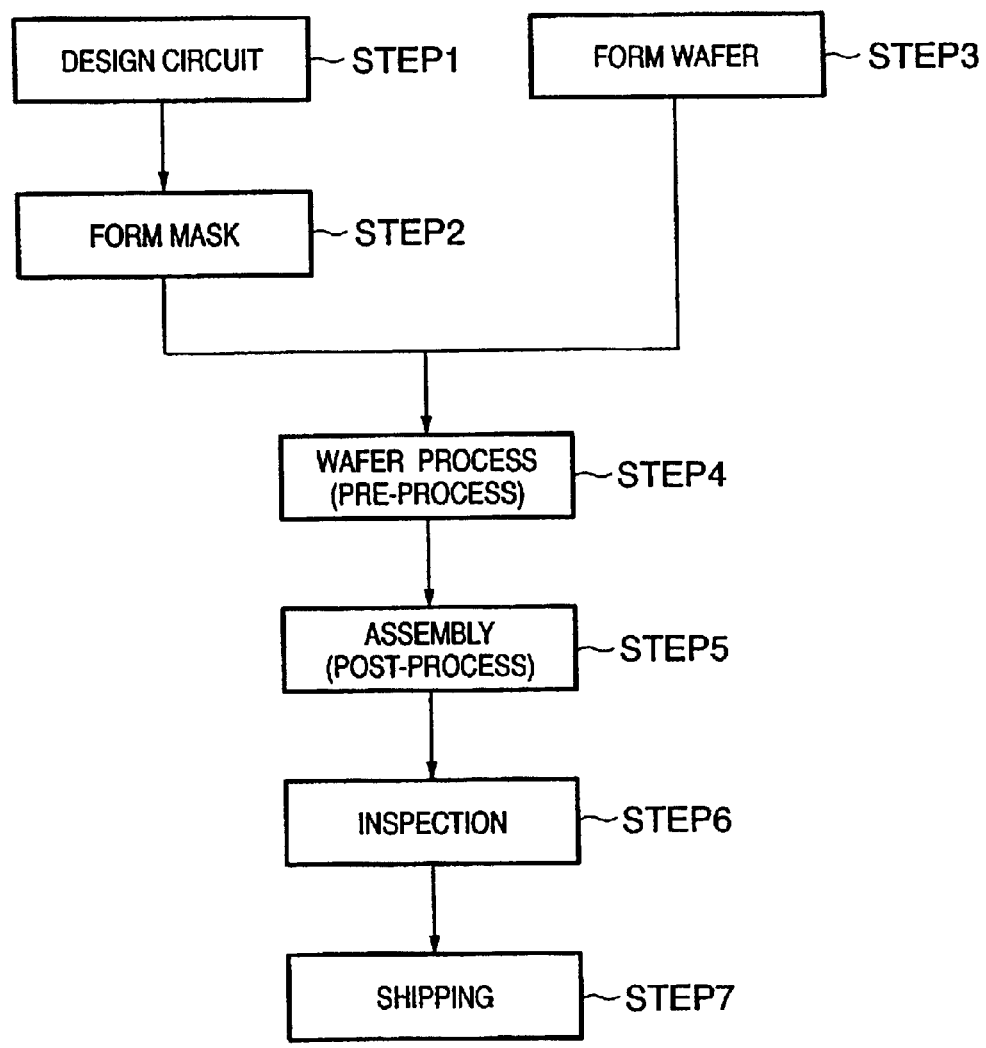
FIG. 18 is a flow chart for explaining the flow of a device manufacturing process.

A semiconductor device manufacturing process using the above-described production system will be explained. FIG. 18 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer.

Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test.

After these steps, the semiconductor device is completed and shipped (step 7). For example, the pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 19:
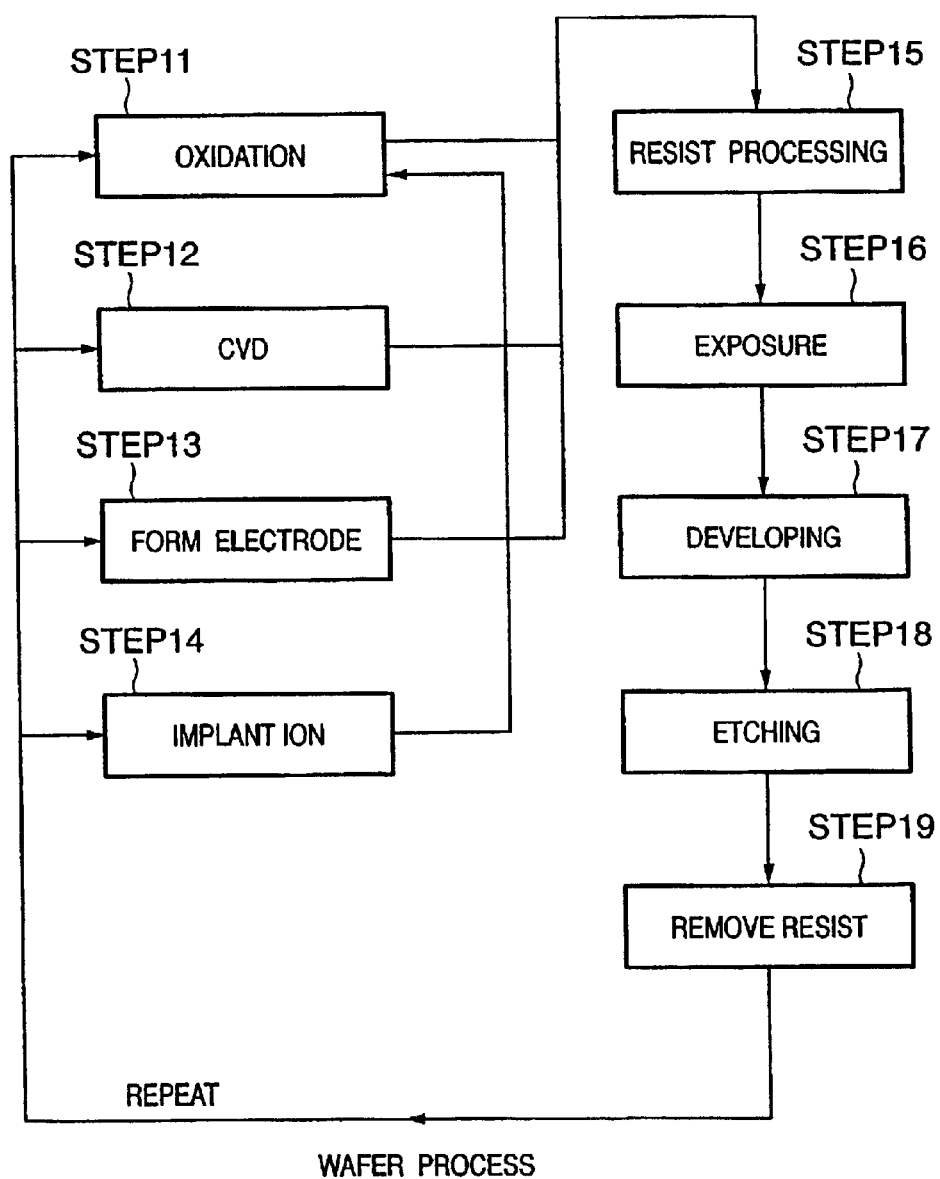
FIG. 19 is a flow chart for explaining a wafer process.

FIG. 19 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask, and prints the circuit pattern on the wafer. In step 17 (developing), the exposed wafer is developed. In step 18 (etching), the resist is etched except for the developed resist image. In step 19 (resist removal), an unnecessary resist after etching is removed.

These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. Accordingly, the productivity of the semiconductor device can be increased in comparison with the prior art.

According to the present invention, gas purge in the pellicle space of a master with a pellicle loaded into an apparatus can be efficiently performed within a short time in a projection exposure apparatus using ultraviolet rays such as a fluorine excimer laser beam as a light source. Exposure can be stably controlled at high precision without degrading the productivity of the exposure apparatus, and a fine circuit pattern can be stably projected at high precision.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus in which a pellicle support frame which has a freely openable/closable lid and forms a pellicle space by using a pellicle film is mounted, and a pattern of a master facing the pellicle space is transferred onto a photosensitive substrate via a projection optical system, comprising:

a mechanism which opens/closes the lid;

a nozzle arranged by selecting at least either one of a gas supply nozzle and a discharge nozzle, wherein at least either one of a gas supply and discharge is performed for the pellicle space via said selected nozzle;

means for measuring flexure of the pellicle film;

pressure detection means for detecting either one of a gas supply pressure and a discharge pressure; and pressure control means for controlling the pressure detected by said pressure detection means, wherein said pressure control means controls either one of the gas supply pressure and the discharge pressure so as to adjust a flexure value detected by said means for measuring flexure of the pellicle film to not more than a predetermined value.

2. An exposure apparatus in which a pellicle support frame which has a freely openable/closable lid and forms a pellicle space by using a pellicle film is mounted, and a pattern of a master facing the pellicle space is transferred onto a photosensitive substrate via a projection optical system, comprising:

a mechanism which opens/closes the lid;

a nozzle arranged by selecting at least either one of a gas supply nozzle and a discharge nozzle, wherein at least either one of gas supply and discharge is performed for the pellicle space via said selected nozzle;

means for measuring flexure of the pellicle film;

speed detection means for detecting either one of a gas supply speed and a discharge speed; and speed control means for controlling the speed detected by said speed detection means, wherein said speed control means controls either one of the gas supply speed and the discharge speed so as to adjust a flexure value detected by said means for measuring flexure of the pellicle film to not more than a predetermined value.

3. The apparatus according to claim 1 or 2, wherein said mechanism which opens/closes the lid and said selected nozzle are arranged in any one of a master load-lock chamber, a master stocker, and a master stage.

4. The apparatus according to claim 1 or 2, wherein said means for measuring flexure of the pellicle film includes light-projecting means for emitting collimated light, light receiving means formed from a sensor which measures a position of light emitted by said light-projecting means and reflected by the pellicle film, and arithmetic means for calculating flexure of the pellicle film from a light reception position.

5. The a apparatus according to claim 1 or 2, wherein said means for measuring flexure of the pellicle film includes means using any one of a limited-reflection photoelectric sensor, an electrostatic capacitance sensor, and an ultrasonic displacement sensor.

6. The apparatus according to claim 1 or 2, wherein a light-projecting portion is received by said means for measuring flexure of the pellicle film.

7. The apparatus according to claim 1 or 2, wherein the gas filled in the space surrounded by the master and the pellicle film includes inert gas.

* * * * *

UNITED STATES PATENT AND TRADEMARK OFFICE
CERTIFICATE OF CORRECTION

PATENT NO. : 6,762,821 B2
DATED : July 13, 2004
INVENTOR(S) : Takashi Kamono

It is certified that error appears in the above-identified patent and that said Letters Patent is hereby corrected as shown below:

<u>Title page,</u>
Item [56], References Cited, OTHER PUBLICATIONS, "Publicati n," should read -- Publication, --.

<u>Column 11,</u>
Line 19, "N=IN t/(-190x1)," should read -- N=In T/(-190xI), --.

<u>Column 18,</u>
Lines 42 and 46, "130" should read -- 1302 --.

<u>Column 21,</u>
Line 39, "40," should read -- 402, --.

<u>Column 24,</u>
Line 6, "includes" should read -- includes: --.
Line 14, "a" should be deleted.

Signed and Sealed this

Fifth Day of April, 2005

JON W. DUDAS
*Director of the United States Patent and Trademark Office*